US011581514B2

(12) United States Patent
Kim et al.

(10) Patent No.: US 11,581,514 B2
(45) Date of Patent: Feb. 14, 2023

(54) DISPLAY DEVICE HAVING A REAR COVER LAYER

(71) Applicant: Samsung Display Co., Ltd., Yongin-si (KR)

(72) Inventors: Youngmin Kim, Yongin-si (KR); Yongseung Park, Yongin-si (KR); Jawoon Lee, Yongin-si (KR); Minjun Jo, Yongin-si (KR); Haeri Choi, Yongin-si (KR); Hyunmin Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 118 days.

(21) Appl. No.: 16/944,900

(22) Filed: Jul. 31, 2020

(65) Prior Publication Data

US 2021/0104705 A1    Apr. 8, 2021

(30) Foreign Application Priority Data

Oct. 2, 2019  (KR) .......................... 10-2019-0122504

(51) Int. Cl.
*H01L 51/00* (2006.01)
*H01L 51/52* (2006.01)
(Continued)

(52) U.S. Cl.
CPC ........ *H01L 51/5271* (2013.01); *H01L 27/323* (2013.01); *H01L 27/3244* (2013.01);
(Continued)

(58) Field of Classification Search
CPC ............. H01L 51/5271; H01L 51/0097; H01L 51/5253; H01L 51/5293; H01L 2251/5338;
(Continued)

(56) References Cited

U.S. PATENT DOCUMENTS 10,135,025 B2 *  11/2018  Kim ..................... H01L 51/5253
10,186,191 B2    1/2019   Kang et al.
(Continued)

FOREIGN PATENT DOCUMENTS

CN       107946341 A *  4/2018  ......... H01L 27/3227
CN       107946341 A     4/2018
(Continued)

OTHER PUBLICATIONS

European Patent Office, European Search Report issued in corresponding European Patent Application No. 20198268.3, dated Mar. 4, 2021, 10 pages.

*Primary Examiner* — Ida M Soward
(74) *Attorney, Agent, or Firm* — Lewis Roca Rothgerber Christie LLP

(57) ABSTRACT

A display device includes: a substrate; an insulating layer on a top surface of the substrate; a plurality of light-emitting diodes on the insulating layer and including two light-emitting diodes spaced apart from each other and having a transmission area therebetween; an encapsulation member covering the plurality of light-emitting diodes; and a rear cover layer located on a rear surface of the substrate and including a first portion located in the transmission area, wherein the first portion includes a transparent material.

35 Claims, 22 Drawing Sheets

(51) Int. Cl.
- H01L 33/44 (2010.01)
- H01L 27/32 (2006.01)
- H01L 27/14 (2006.01)
- G02F 1/13 (2006.01)
- *G02F 1/1335* (2006.01)
- *H01L 27/146* (2006.01)
- *G02F 1/1333* (2006.01)
- *G02F 1/1362* (2006.01)

(52) U.S. Cl.
CPC ...... H01L 51/0097 (2013.01); H01L 51/5253 (2013.01); H01L 51/5281 (2013.01); *G02F 1/133331* (2021.01); *G02F 1/133512* (2013.01); *G02F 1/133528* (2013.01); *G02F 1/136209* (2013.01); *G09G 2300/0408* (2013.01); *G09G 2300/0804* (2013.01); *G09G 2300/0876* (2013.01); *H01L 27/14678* (2013.01); *H01L 27/322* (2013.01); *H01L 27/3246* (2013.01); *H01L 27/3248* (2013.01); *H01L 27/3258* (2013.01); *H01L 27/3265* (2013.01); *H01L 27/3274* (2013.01); *H01L 33/44* (2013.01); *H01L 51/5284* (2013.01); *H01L 51/5293* (2013.01); *H01L 2251/301* (2013.01); *H01L 2251/5338* (2013.01)

(58) Field of Classification Search
CPC ............... H01L 2251/301; H01L 33/44; H01L 27/3258; H01L 27/3248; H01L 27/3274; G02F 1/133528; G02F 1/133331; G02F 1/133512; G02F 1/136209; G09G 2300/0408; G09G 2300/0804; G09G 2300/0876

See application file for complete search history.

(56) References Cited

U.S. PATENT DOCUMENTS

| | | | | |
|---|---|---|---|---|
| 10,304,913 B2* | 5/2019 | Choi | ............... | H01L 51/5237 |
| 10,466,822 B2 | 11/2019 | Kim et al. | | |
| 10,680,205 B2* | 6/2020 | Choi | ............... | H01L 27/323 |
| 10,700,155 B2* | 6/2020 | Ka | ............... | H01L 51/56 |
| 10,969,889 B2* | 4/2021 | Jeong | ............... | H01L 51/0096 |
| 10,978,537 B2* | 4/2021 | Ebisuno | ............... | H01L 27/3276 |
| 11,063,237 B2* | 7/2021 | Kim | ............... | H01L 27/1218 |
| 11,121,343 B2* | 9/2021 | Kanaya | ............... | H01L 51/5056 |
| 2013/0319748 A1* | 12/2013 | Ishii | ............... | H05K 1/111 174/262 |
| 2016/0233289 A1* | 8/2016 | Son | ............... | H01L 51/52 |
| 2016/0293687 A1* | 10/2016 | Chang | ............... | H01L 51/5284 |
| 2018/0090698 A1* | 3/2018 | Jeong | ............... | H01L 51/003 |
| 2020/0287161 A1 | 9/2020 | Kim | | |
| 2021/0055817 A1* | 2/2021 | Shin | ............... | H01L 27/3244 |
| 2021/0083023 A1* | 3/2021 | Zheng | ............... | H01L 51/5253 |
| 2021/0151715 A1* | 5/2021 | Lee | ............... | H01L 27/3246 |
| 2021/0210716 A1* | 7/2021 | Park | ............... | H01L 27/323 |
| 2021/0359051 A1* | 11/2021 | Jin | ............... | H01L 27/3258 |

FOREIGN PATENT DOCUMENTS

| | | | | |
|---|---|---|---|---|
| CN | 109860266 A | * | 6/2019 | ......... H01L 27/3246 |
| CN | 109860266 A | | 6/2019 | |
| CN | 110085650 A | * | 8/2019 | ........... H01L 27/322 |
| CN | 110085650 A | | 8/2019 | |
| CN | 110211972 A | | 9/2019 | |
| EP | 3660821 A1 | | 6/2020 | |
| KR | 10-1536709 B1 | | 7/2015 | |
| KR | 10-2017-0065059 A | | 6/2017 | |
| KR | 10-2017-0066767 A | | 6/2017 | |
| KR | 10-2018-0063633 A | | 6/2018 | |
| WO | 2019/047126 A1 | | 3/2019 | |

* cited by examiner

DISPLAY DEVICE HAVING A REAR COVER LAYER

CROSS-REFERENCE TO RELATED APPLICATION

This application claims priority to and the benefit of Korean Patent Application No. 10-2019-0122504, filed on Oct. 2, 2019, in the Korean Intellectual Property Office, the entire content of which is incorporated herein by reference.

BACKGROUND

1. Field

One or more embodiments relate to a display device, and for example, to a display device including a transmission area.

2. Description of Related Art

Recently, the purposes of a display device have become more diversified. As display devices have become thinner and more lightweight, their range of use has gradually been extended.

An area occupied by a display area of a display device has increased (e.g., relative to the overall size of the display device) and functions that may be combined or associated with a display device are being added. As ways of adding various functions while increasing an area, research on a display device including an area for adding various functions instead of displaying an image inside a display area is in constant progress.

SUMMARY

An area for adding various functions inside a display area may include a transmission area that may transmit light and/or sound. One or more embodiments include a display device that has a structure in which a light transmission quality in a transmission area may be improved. However, it should be understood that embodiments described herein should be considered in a descriptive sense only and not for limitation of the disclosure.

Additional aspects of embodiments will be set forth in part in the description which follows and, in part, will be apparent from the description, or may be learned by practice of the presented embodiments of the disclosure.

According to one or more embodiments, a display device includes a substrate, an insulating layer on a top surface of the substrate, a plurality of light-emitting diodes on the insulating layer and including two light-emitting diodes spaced apart from each other and having a transmission area therebetween, an encapsulation member covering the plurality of light-emitting diodes, and a rear cover layer located on a rear surface of the substrate and including a first portion located in the transmission area, wherein the first portion includes a transparent material.

A difference between a refractive index of the first portion of the rear cover layer and a refractive index of the substrate may be 0.5 or less.

The rear surface of the substrate may include a plurality of dimples, and at least one dimple that is located in the transmission area, from among the plurality of dimples, may be filled with the transparent material of the first portion.

The substrate may include a glass material and/or a polymer resin.

The display device may further include a first insulating layer on the top surface of the substrate, a second insulating layer between a semiconductor layer of a transistor and a gate electrode, the transistor being on the first insulating layer, and a third insulating layer between the transistor and the plurality of light-emitting diodes, wherein at least one selected from the first insulating layer, the second insulating layer, and the third insulating layer may include a through hole located in the transmission area.

Each of the first insulating layer, the second insulating layer, and the third insulating layer may include a through hole located in the transmission area, and a width of a through hole having a smallest size among the through holes may be less than a width of the first portion.

The rear cover layer may include the first portion and a second portion surrounding the first portion, and a thickness of the second portion may be greater than a thickness of the first portion such that the first portion together with the second portion forms a step difference in the rear cover layer.

The step difference between the first portion and the second portion may have an inclination surface, and a thickness of a portion of the rear cover layer that constitutes the inclination surface may be greater than the thickness of the first portion and less than the thickness of the second portion.

The first portion may be apart from the second portion.

The rear cover layer may include a first sub-layer on the rear surface of the substrate and including the first portion, and a second sub-layer on the first sub-layer and including an opening corresponding to the transmission area.

The second sub-layer may include a material different from that of the first sub-layer.

The encapsulation member may include an encapsulation substrate of a glass material.

The display device may further include an air layer between the substrate and the encapsulation substrate.

The display device may further include a transparent material layer between the substrate and the encapsulation substrate.

The encapsulation member may include a thin-film encapsulation layer including at least one inorganic encapsulation layer and at least one organic encapsulation layer.

The thin-film encapsulation layer may include a hole corresponding to the transmission area.

According to one or more embodiments, a display device includes a substrate, a display layer on a top surface of the substrate and including two pixels spaced apart from each other and having a transmission area therebetween, and a rear cover layer on a rear surface of the substrate and including a first portion corresponding to the transmission area, wherein the first portion of the rear cover layer includes a transparent material.

A difference between a refractive index of the rear cover layer and a refractive index of the substrate may be 0.5 or less.

The substrate may include a glass material and/or a polymer resin.

The rear surface of the substrate may include a plurality of dimples, and at least one dimple that corresponds to the transmission area, from among the plurality of dimples, may be filled with the transparent material of the first portion.

The display layer may include at least one insulating layer located on the top surface of the substrate and including a through hole corresponding to the transmission area, and a pixel electrode, an opposite electrode, and a stacked body each on the at least one insulating layer, the stacked body being between the pixel electrode and the opposite electrode.

The display layer may include a hole located in the transmission area.

A width of the hole of the display layer may be less than a width of the first portion.

The rear cover layer may include the first portion and a second portion surrounding the first portion, and a thickness of the second portion may be greater than a thickness of the first portion such that the first portion together with the second portion forms a step difference in the rear cover layer.

The step difference between the first portion and the second portion may have an inclination surface, and a thickness of a portion of the rear cover layer that constitutes the inclination surface may be greater than the thickness of the first portion and less than the thickness of the second portion.

The first portion may be apart from the second portion.

The rear cover layer may include a first sub-layer on the rear surface of the substrate, and a second sub-layer on the first sub-layer and including an opening corresponding to the transmission area.

The second sub-layer may include a material different from that of the first sub-layer.

The display device may further include an encapsulation substrate covering the display layer and including a glass material.

The display device may further include an air layer between the substrate and the encapsulation substrate.

The display device may further include a transparent material layer between the substrate and the encapsulation substrate.

The display device may further include a thin-film encapsulation layer covering the display area and including at least one inorganic encapsulation layer and at least one organic encapsulation layer.

The thin-film encapsulation layer may include a hole corresponding to the transmission area.

The above and other aspects and features of certain embodiments of the disclosure will be more apparent from the following description, the accompanying drawings, and claims.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
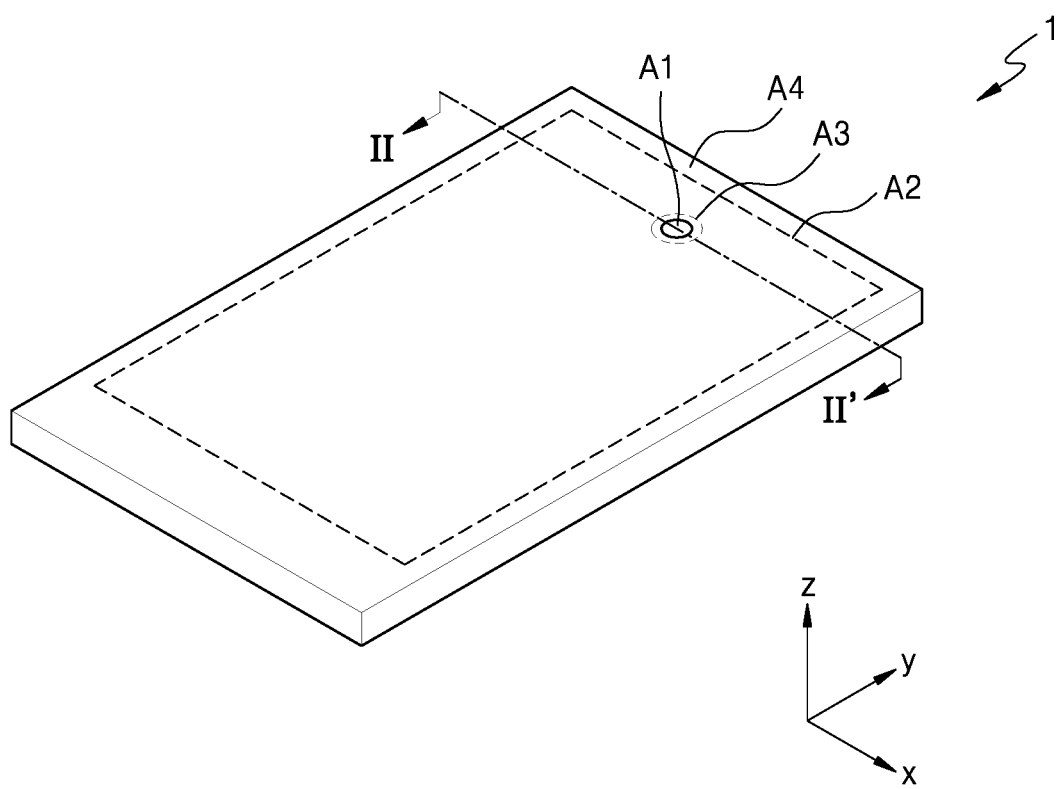
FIG. 1 is a perspective view of a display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present embodiments are described in more detail with reference to the accompanying drawings. In the drawings, the same reference numerals are given to the same or corresponding elements, and repeated description thereof is omitted.

It will be understood that although the terms "first," "second," etc. may be used herein to describe various components, these components should not be limited by these terms. These terms are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. For example, intervening layers, regions, or components may be present.

Sizes of elements in the drawings may be exaggerated for convenience of explanation. In other words, because sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "coupled" to another layer, region, or component, it may be "directly coupled" to the other layer, region, or component and/or may be "indirectly coupled" to the other layer, region, or component with other layer, region, or component interposed therebetween. For example, it will be understood that when a layer, region, or component is referred to as being "electrically coupled" to another layer, region, or component, it may be "directly electrically coupled" to the other layer, region, or component and/or may be "indirectly electrically coupled" to other layer, region, or component with other layer, region, or component interposed therebetween.

FIG. 1 is a perspective view of a display device according to an embodiment.

Referring to FIG. 1, a display device 1 may include a first area A1 and a second area A2 surrounding the first area A1. A plurality of pixels, for example, an array of pixels, may be in the second area A2. In some embodiments, the array of pixels, are in the second area A2, but not the first area A1 (e.g., only the second area A2 may include pixels and the first area may not include any pixels). The second area A2 may display an image through the array of pixels. The second area A2 corresponds to an active area that may display an image. The first area A1 may be entirely surrounded by the second area A2. The first area A1 may be an area in which a component may be included, the component giving various suitable functions to the display device 1. For example, in the case where the component includes a sensor, a camera, etc. that use light, the first area A1 corresponds to a transmission area that may transmit light (e.g., visible light, infrared light, and/or ultraviolet light) of the sensor or light progressing to the camera. In some embodiments, in the case where the component includes a sensor that uses sound, for example super sound (e.g., ultrasonic waves), the first area A1 corresponds to a transmission area that may transmit sound of the sensor. For example, the transmission area may transit sound (e.g., ultrasonic waves) to or from the sensor.

A third area A3 may be provided between the first area A1 and the second area A2. The third area A3 may be a kind of non-display area in which pixels are not arranged. For example, the third area A3 may not include any pixels. Like the third area A3, a fourth area A4 surrounding the second area A2 may be a kind of non-display area in which pixels are not arranged. For example, the fourth area may not include any pixels. Various suitable kinds of wirings, circuits, etc. may be in the fourth area A4.

Each pixel of the display device 1 may include a light-emitting diode as a display element that may emit light (e.g., visible light) of a set or predetermined color. The light-emitting diode may include an organic light-emitting diode including an organic material as an emission layer. In some embodiments, the light-emitting diode may include an inorganic light-emitting diode. In some embodiments, the light-emitting diode may include quantum dots as the emission layer. Hereinafter, for convenience of description, the case where the light-emitting diode includes an organic light-emitting diode is described, but the present disclosure is not limited thereto.

Though it is shown in FIG. 1 that the first area A1 is in a central portion of the second area A2 in a width direction (e.g., ±x direction) of the display device 1, the embodiment is not limited thereto. In another embodiment, the first area A1 may be offset on the left or the right in the width direction of the display device 1. In some embodiments, the first area A1 may be at various suitable locations such as, for example, an upper side, a central portion, or a bottom side in a lengthwise direction (e.g., ±y direction) of the display device 1. As used herein, the term "±x direction" may refer to either direction along the X axis shown in FIG. 1, and the term "±y direction" may refer to either direction along the Y axis shown in FIG. 1. The Z axis shown in FIG. 1 is perpendicular or substantially perpendicular to the X and Y axes.

Though it is shown in FIG. 1 that the display device 1 includes one first area A1, the display device 1 may include a plurality of first areas A1 in another embodiment.

Figure 2:
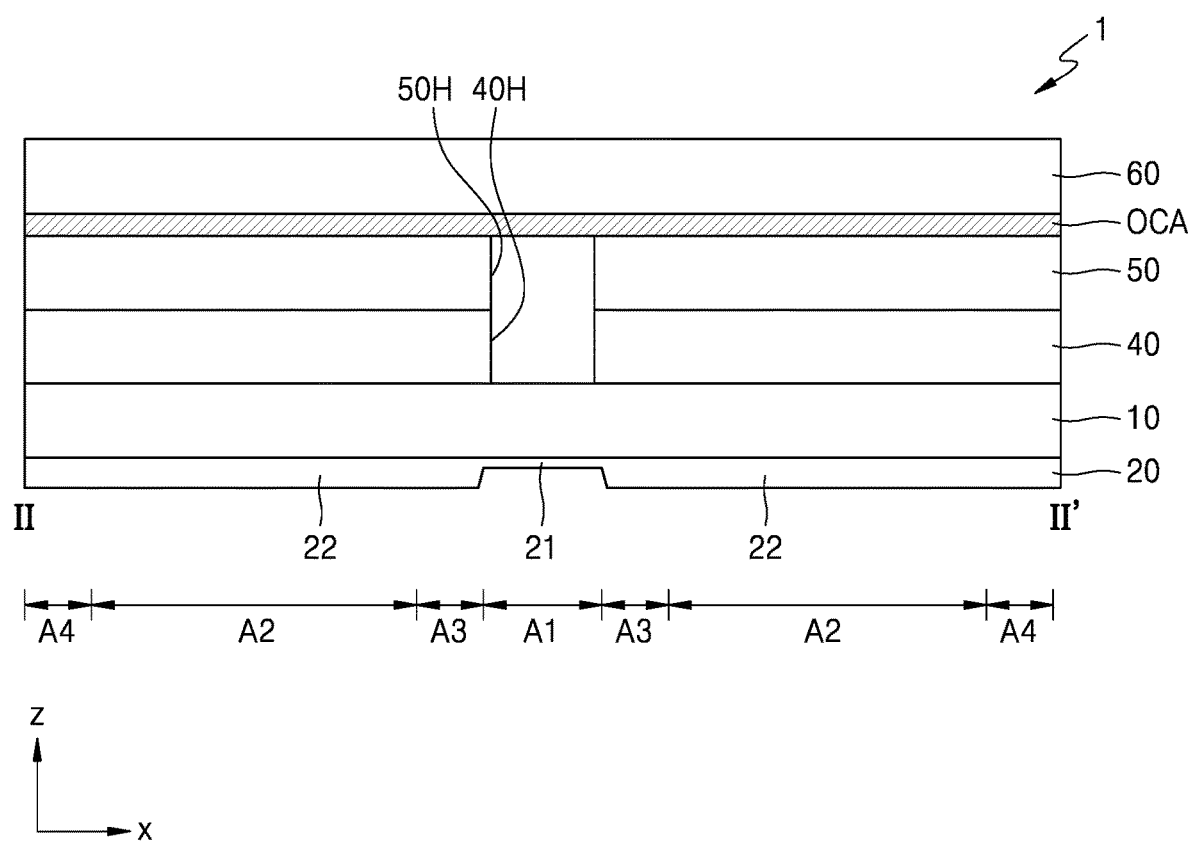
FIG. 2 is a cross-sectional view of a display device according to an embodiment.
Figure 3:
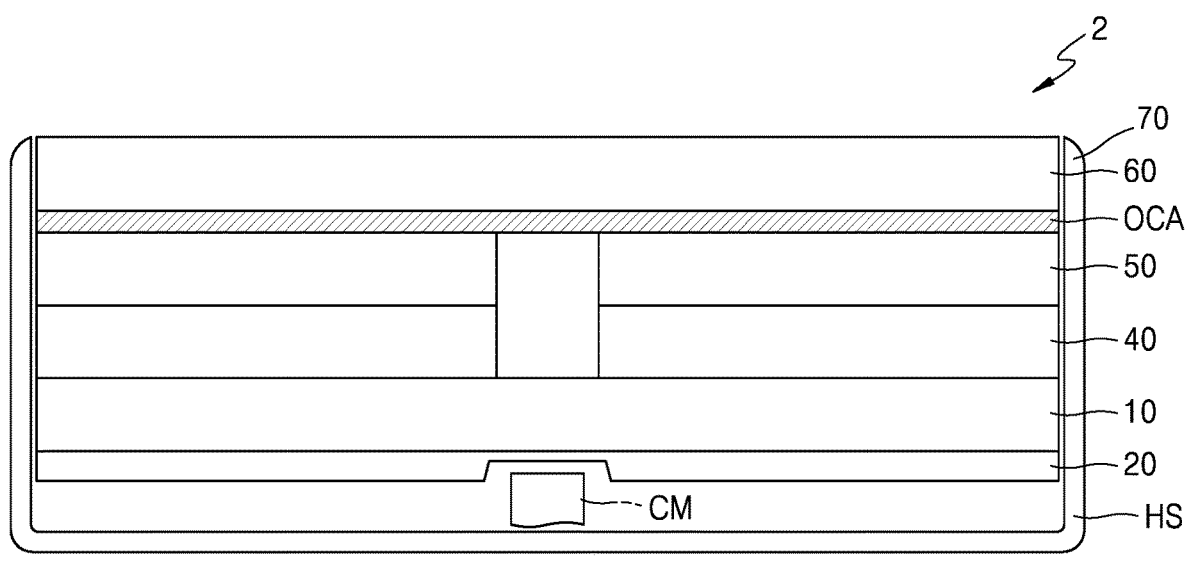
FIG. 3 is a cross-sectional view of an electronic apparatus including a display device according to an embodiment.

FIG. 2 is a cross-sectional view of the display device 1 according to an embodiment taken along line II-II' of FIG. 1, and FIG. 3 is a cross-sectional view of an electronic apparatus including the display device 1 according to an embodiment.

Referring to FIG. 2, the display device 1 may include a display panel 10, a rear cover layer 20 on a rear side (rear surface) of the display panel 10, an input sensing section 40 on a top surface of the display panel 10, and an optical functional section 50 on the top surface of the display panel 10. A window 60 may be coupled to an element thereunder, for example, the optical functional section 50 through an adhesive layer such as, for example, an optically clear adhesive (OCA).

The display panel 10 may include a plurality of diodes in the second area A2. In some embodiments, the plurality of diodes are only in the second area A2 (e.g., the plurality of diodes are not in the first area A1, the third area A3, and/or the fourth area A4). The rear cover layer 20 may cover at least a portion of the rear side of the display panel 10 while filling a fine concave structure (referred to as a dimple, hereinafter) that occurs during a process of manufacturing the display panel 10. The concave structure (e.g., dimple) described herein may have any suitable shape such as, for example, a half circle structure and/or the like.

The input sensing section 40 may obtain coordinate information corresponding to an external input such as, for example, a touch event (e.g., a touch or near touch by a user). The input sensing section 40 may include a sensing electrode or a touch electrode and trace lines coupled to the sensing electrode. The input sensing section 40 may be on the display panel 10. The input sensing section 40 may sense an external input (e.g., a touch or near touch by a user) by using a mutual capacitance method or a self capacitance method.

The input sensing section 40 may be directly formed on the display panel 10. In some embodiments, the input sensing section 40 may be separately formed and then coupled to the display panel 10 through an adhesive layer such as, for example, an optically clear adhesive (OCA). In an embodiment, as shown in FIG. 2, the input sensing section 40 may be directly formed on the display panel 10.

In this case, the adhesive layer may not be between the input sensing section 40 and the display panel 10.

The optical functional section 50 may include a reflection prevention layer. The reflection prevention layer may reduce reflectivity (e.g., reflection) of light (external light, e.g., visible light) incident toward the display panel 10 from the outside through the window 60. The reflection prevention layer may include a retarder and a polarizer. The retarder may include a film-type retarder or a liquid crystal-type retarder. The retarder may include a half wavelength ($\lambda/2$) retarder and/or a quarter wavelength ($\lambda/4$) retarder. The polarizer may include a film-type polarizer or a liquid crystal-type polarizer. The film-type polarizer may include a stretchable synthetic resin film, and the liquid crystal-type polarizer may include liquid crystals in a set or predetermined arrangement. Each of the retarder and the polarizer may independently further include a protective film.

In another embodiment, the reflection prevention layer may include a structure such as, for example, a black matrix and color filters. The color filters may be arranged by taking into account colors of pieces of light emitted respectively from the pixels of the display panel 10. For example, the color filters may be arranged according to the color of light respectively emitted from the pixels of the display panel 10. In another embodiment, the reflection prevention layer may include a destructive interference structure. The destructive interference structure may include a first reflection layer and a second reflection layer respectively on different layers. First-reflected light and second-reflected light respectively reflected by the first reflection layer and the second reflection layer may create destructive-interference and thus the reflectivity (e.g., reflection) of external light may be reduced by the destructive interference structure.

The optical functional section 50 may include a lens layer. The lens layer may improve emission efficiency of light emitted from the display panel 10 or reduce color deviation (e.g., an unwanted change in color). The lens layer may include a layer having a concave or convex lens shape and/or include a plurality of layers respectively having different refractive indexes. For example, the respective refractive indexes of the plurality of layers may be different from each other. The optical functional section 50 may include both the reflection prevention layer and the lens layer, or include one of these layers.

Referring to FIG. 3, the display device 1 may be provided to various suitable electronic apparatuses 2 such as, for example, mobile phones, tablet personal computers, notebook computers, and smartwatches. The electronic apparatus 2 may include a housing HS having a space therein. The display panel 10 may be inside the housing HS. The window 60 may be coupled to the housing HS. As described above, the input sensing section 40 and the optical functional section 50 may be on a top surface of the display panel 10. The rear cover layer 20 may be on the rear side of the display panel 10.

A component CM may be inside the housing HS and located between the display panel 10 and the bottom of the housing HS. The component CM may be located in the first area A1. The component CM may include an electronic element. For example, the component CM may be an electronic element that uses light or sound (e.g., sends or receives sound (e.g., ultrasound waves), visible light, infrared light, and/or ultraviolet light and performs an operation based on the light received). For example, the electronic element may be a sensor such as an infrared sensor that emits and/or receives light, a camera that receives light and captures an image, a sensor that outputs and senses light to measure a distance or recognize a fingerprint, a small lamp that outputs light, a speaker for outputting sound, and/or a sensor for receiving sound (e.g., ultrasound waves). The electronic element that uses light may use light in various suitable wavelength bands such as, for example, visible light, infrared light, and/or ultraviolet light. In an embodiment, the first area A1 may be a transmission area through which light that is output from the component CM to the outside or propagates toward the electronic element from the outside, may pass. For example, in the case where the component CM includes a camera, a transmittance (e.g., light transmittance) of the first area A1 in the display device 1 may be about 80% or more. In some embodiments, in the case where the component CM includes a sensor, a transmittance (e.g., light and/or sound transmittance) of the first area A1 in the display device 1 may be a value less than 80%, for example, 50% or more, or 60% or more.

To prevent or reduce a decrease in a transmittance by elements on a progression path of light emitted from the component CM or progressing to the component CM, at least one of the display panel 10, the input sensing section 40, and the optical functional section 50 may include a hole. In an embodiment, FIG. 2 shows each of the input sensing section 40 and the optical functional section 50 includes a hole.

Referring to FIG. 2, the input sensing section 40 may include a first hole 40H passing through a top surface and a bottom surface of the input sensing section 40, and the optical functional section 50 may include a second hole 50H passing through a top surface and a bottom surface of the optical functional section 50. The first hole 40H and the second hole 50H may be in the first area A1 and may overlap each other.

The display panel 10 may not include a hole passing through a top surface and a bottom surface of the display panel 10. In this case, there may be a dimple in a rear side of the display panel 10. Because a dimple may have a function as a lens with its shape itself, progression of a wave (e.g., light and/or sound wave) progressing to the component CM or emitted from the component CM may be distorted by the dimple. However, according to embodiments, because the rear cover layer 20 is provided so as to directly contact the rear side of the display panel 10, the above distortion issue may be prevented or reduced.

The rear cover layer 20 may include a transparent material in which a difference between a refractive index of the transparent material and a refractive index of the display panel 10, for example, the substrate of the display panel 10 is 0.5 or less. Because the first area A1 is the transmission area in which the component CM may be arranged as described above, to prevent or reduce a decrease in the transmittance of the first area A1, a first portion 21 of the rear cover layer 20 corresponding to the first area A1 may have a thickness less than a thickness of the other portion 22 (referred to as a second portion, hereinafter).

Figure 4:
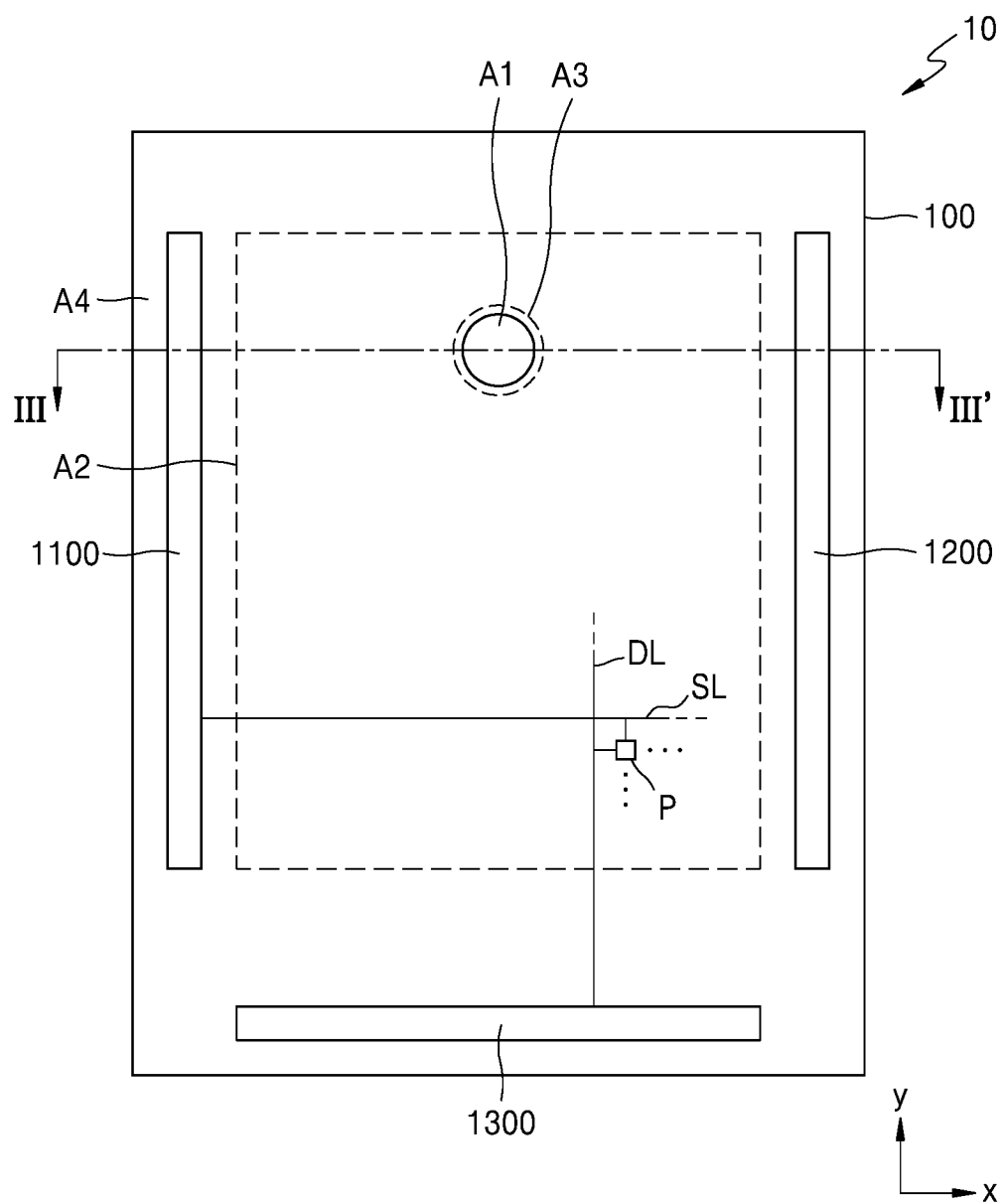
FIG. 4 is a plan view of a display panel according to an embodiment.
Figure 5:
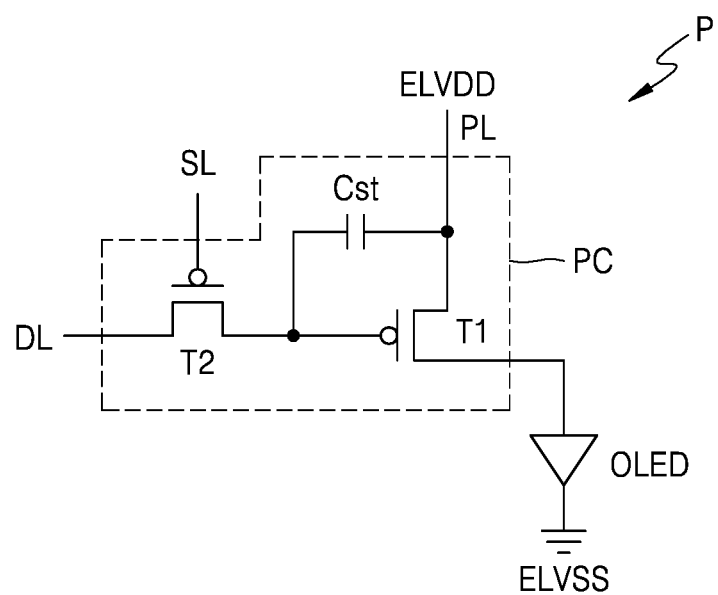
FIG. 5 is an equivalent circuit diagram of a pixel of a display panel according to an embodiment.

FIG. 4 is a plan view of the display panel 10 according to an embodiment, and FIG. 5 is an equivalent circuit diagram of one of pixels of the display panel 10.

A figure of the display panel 10 may be substantially the same as the figure of the display device 1 described above with reference to FIG. 1. For example, as shown in FIG. 5, the display panel 10 may include the first area A1, the second area A2, the third area A3, and the fourth area A4, the second area A2 surrounding the first area A1, the third area A3 being between the first area A1 and the second area A2, and the fourth area A4 surrounding the second area A2.

The display panel 10 may include a plurality of pixels P in the second area A2. As shown in FIG. 5, each pixel P includes a pixel circuit PC and an organic light-emitting diode OLED as a display element coupled to the pixel circuit PC. The pixel circuit PC may include a first transistor T1, a second transistor T2, and a storage capacitor Cst. Each pixel P may emit, for example, red, green, or blue light or emit red, green, blue, or white light from the organic light-emitting diode OLED. The first transistor T1 and the second transistor T2 may be implemented as thin film transistors.

The second transistor T2 is a switching transistor. The second transistor T2 may be coupled to a scan line SL and a data line DL, and configured to transfer a data voltage input from the data line DL to the first transistor T1 in response to a switching voltage input from the scan line SL. The storage capacitor Cst may be coupled to the second transistor T2 and a driving voltage line PL and may store a voltage corresponding to a difference between a voltage transferred from the second transistor T2 and a first power voltage ELVDD supplied through the driving voltage line PL.

The first transistor T1 is a driving transistor. The first transistor T1 may be coupled to the driving voltage line PL and the storage capacitor Cst, and may control a driving current flowing through the organic light-emitting diode OLED from the driving voltage line PL in response to the voltage stored in the storage capacitor Cst. The organic light-emitting diode OLED may emit light having a set or predetermined brightness by using the driving current. An opposite electrode (e.g. a cathode) of the organic light-emitting diode OLED may receive a second power voltage ELVSS.

Though it is shown in FIG. 5 that the pixel circuit PC includes two thin film transistors and one storage capacitor, the present disclosure is not limited thereto. For example, the number of thin film transistors and the number of storage capacitors may be variously modified depending on a design of the pixel circuit PC.

Referring to FIG. 4 again, the third area A3 may surround the first area A1. The third area A3 is an area in which a display element such as, for example, an organic light-emitting diode that emits light is not arranged. Signal lines may pass across the third area A3, the signal lines providing a signal to the pixels P arranged around the first area A1. A first scan driver 1100, a second scan driver 1200, a data driver 1300, and a main power line may be in the fourth area A4, the first scan driver 1100 and the second scan driver 1200 providing a scan signal to each pixel P, the data driver 1300 providing a data signal to each pixel P, and the main power line providing a first power voltage and a second power voltage. The first scan driver 1100 and the second scan driver 1200 each may be in the fourth area A4 and on two opposite sides of the second area A2 with the second area A2 therebetween.

Though it is shown in FIG. 4 that the data driver 1300 is adjacent to one side of the substrate 100, the data driver 1300 may be on a flexible printed circuit board (FPCB) electrically coupled to a pad on one side of the display panel 10 in another embodiment.

Figure 6:
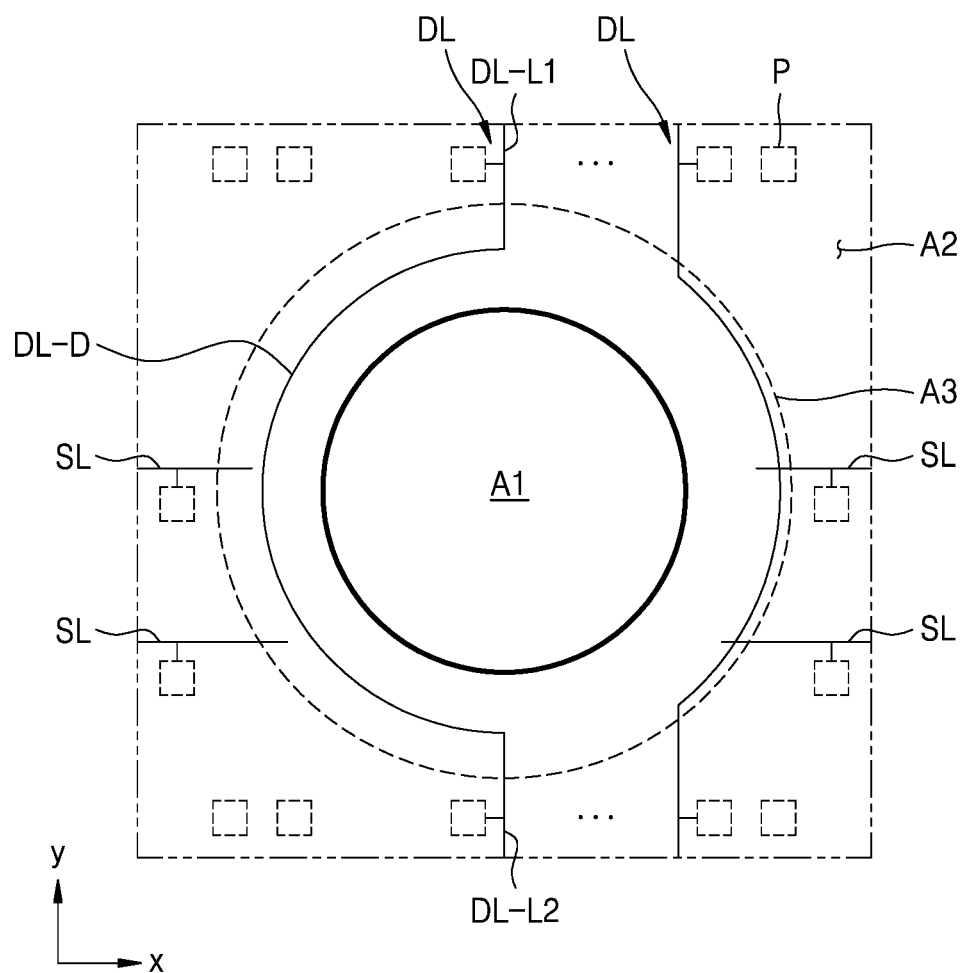
FIG. 6 is a plan view of a portion of a display panel according to an embodiment.

FIG. 6 is a plan view of a portion of the display panel 10 according to an embodiment.

Referring to FIG. 6, some of the pixels P in the second area A2 may be spaced apart from each other around the first area A1. For example, the first area A1 may be between two pixels P arranged in ±x-directions. Similarly, the first area A1 may be between two pixels P arranged in ±y-directions.

The two pixels P arranged in the ±y-directions with the first area A1 therebetween may be electrically coupled to the same data line DL, and the data line DL may be bent in the third area A3. For example, a portion of the data line DL may extend in the third area A3 along an edge or periphery of the first area A1, for example, in a periphery or circular arc direction of the first area A1. The data line DL may include first and second portions DL-L1 and DL-L2, and a third portion DL-D, the first and second portions DL-L1 and DL-L2 extending in the ±y-directions and passing across the second area A2, and the third portion DL-D being coupled to the first and second portions DL-L1 and DL-L2 and extending in the periphery or circular arc direction of the first area A1.

Two pixels P arranged in the ±x-directions with the first area A1 therebetween may be respectively and electrically coupled to different scan lines SL. Scan lines SL on the left of the first area A1 may be electrically coupled to the first scan driver 1100 described above with reference to FIG. 4, and scan lines SL on the right of the first area A1 may be electrically coupled to the second scan driver 1200 described above with reference to FIG. 4. As shown in FIG. 4, in the case where the display panel 10 includes two scan drivers, the pixels P arranged on two opposite sides of the first area A1 may be respectively and electrically to the scan lines SL arranged on the two opposite sides of the first area A1 and spaced apart from each other.

In another embodiment, in the case where one of the scan drivers, for example, the second scan driver 1200 (see FIG. 4) is omitted, the two pixels P arranged in the ±x-directions with the first area A1 therebetween may be coupled to the same scan line, and similarly to the data line DL, the scan line may include a portion extending in the third area A3 in the periphery or arc direction of the first area A1.

Figure 7A:
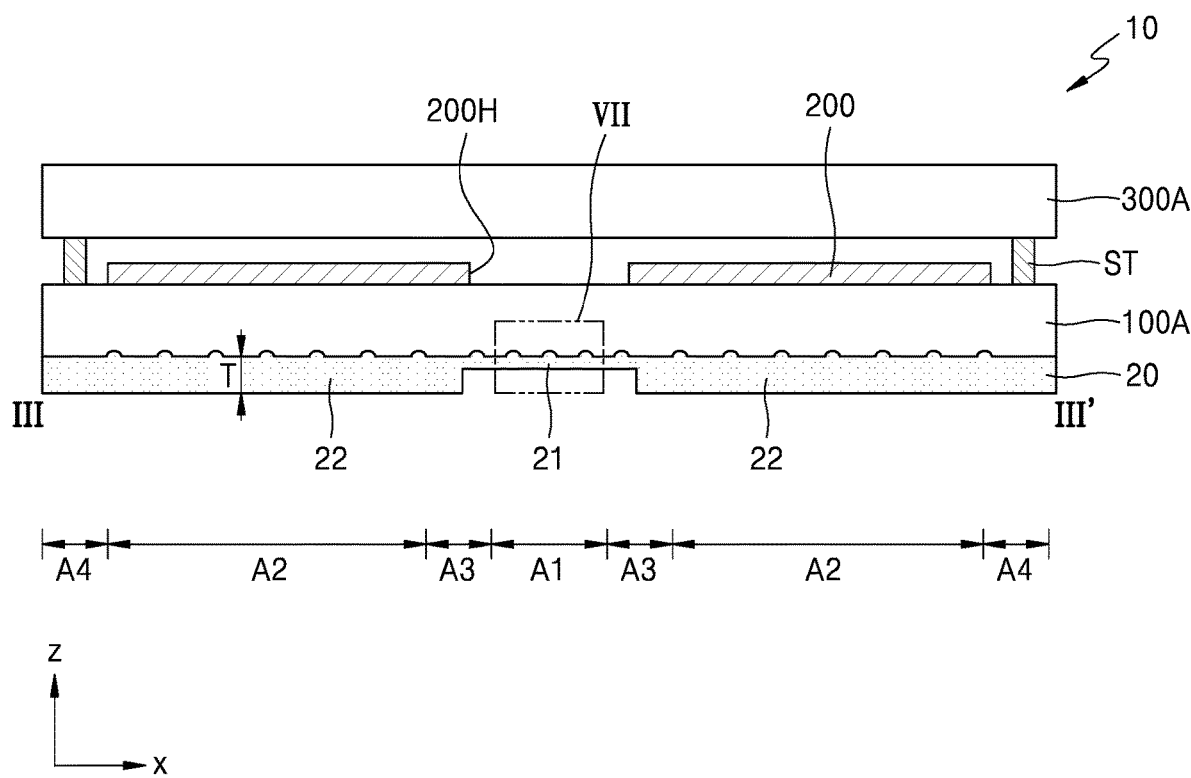
FIG. 7A is a cross-sectional view of a display panel according to an embodiment.
Figure 7B:
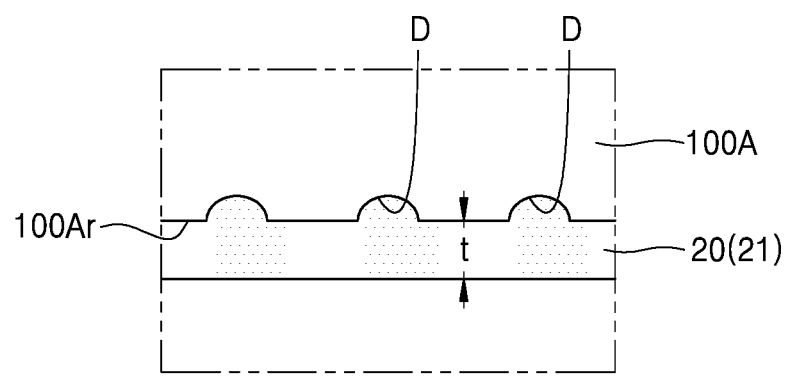
FIG. 7B is an enlarged cross-sectional view of a portion VII of FIG. 7A.
Figure 7C:
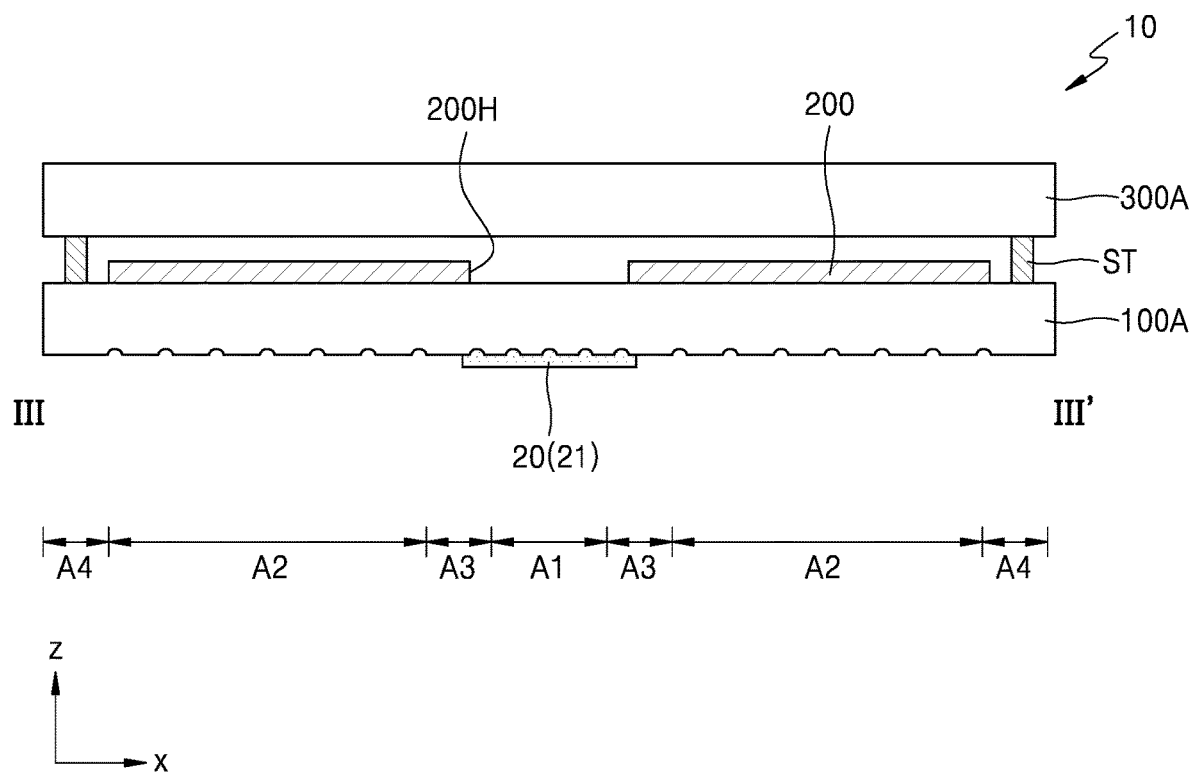
FIG. 7C is a cross-sectional view of a display panel according to an embodiment.

FIG. 7A is a cross-sectional view of the display panel 10 according to an embodiment, taken along line III-III' of FIG. 4, FIG. 7B is an enlarged cross-sectional view of a portion VII of FIG. 7A, and FIG. 7C is a cross-sectional view of the display panel 10 according to an embodiment, taken along line III-III' of FIG. 4.

Referring to FIG. 7A, the display panel 10 may include a display layer 200 on a substrate 100A. The substrate 100A may include a glass material. For example, the substrate 100A may include glass including silicon oxide ($SiO_2$) as a main component. The substrate 100A may include alkali-free glass or soda lime glass.

The display layer 200 may include a plurality of pixels located in the second area A2. Each pixel included in the display layer 200 may include a pixel circuit and a display element electrically coupled to the pixel circuit. The pixel circuit may include a transistor and a storage capacitor, and a display element may include a light-emitting diode, for example, an organic light-emitting diode. The display layer 200 may include a plurality of wirings located in the third area A3.

A portion of the display layer 200, for example, a portion corresponding to the first area A1 may be removed. With regard to this feature, it is shown in FIG. 7A that the display layer 200 includes a fourth hole 200H. The display layer 200 may include the pixel circuits and the display elements described above and further include insulating layers between wirings coupled to each pixel circuit, between electrodes, and/or electrodes of a display element. For example, holes of the insulating layers provided to the display layer 200 may overlap each other to constitute the fourth hole 200H. The fourth hole 200H of the display layer 200 may pass through a top surface and a bottom surface of the display layer 200. An example structure of the fourth hole 200H of the display layer 200 is described below with reference to FIG. 12, etc.

The display layer 200 may be covered by an encapsulation substrate 300A. The encapsulation substrate 300A may include a glass material. For example, the encapsulation substrate 300A may include a glass material including $SiO_2$ as a main component. The encapsulation substrate 300A may face the substrate 100A, and a sealant ST may be between the substrate 100A and the encapsulation substrate 300A. The sealant ST may be located in the fourth area A4 and may entirely surround (or substantially entirely surround) the display layer 200 between the substrate 100A and the encapsulation substrate 300A. When viewed in a direction perpendicular to a top surface of the substrate 100A (e.g., in a z-direction or in a plan view), the second area A2 may be entirely surrounded (or substantially entirely surrounded) by the sealant ST.

A rear side 100Ar of the substrate 100A may include dimples D as shown in an enlarged view of FIG. 7B. The dimples D may be caused or formed during a process of manufacturing the display device 1. A shape thereof may not be constant and a location of each dimple D may be provided at random.

The rear cover layer 20 may directly contact the rear side 100Ar of the substrate 100A. The rear cover layer 20 may have a set or predetermined thickness and at least partially fill the dimple D formed in the substrate 100A. For example, the dimple D may be filled with a material of the rear cover layer 20.

The rear cover layer 20 may include a material in which a difference between a refractive index of the rear cover layer 20 and a refractive index of the substrate 100A is 0.5 or less. In the case where a difference between the refractive index of the rear cover layer 20 and the refractive index of the substrate 100A deviates from the above value (e.g., is greater than 0.5), because the dimple D may operate as a kind of fine lens, a progression path of light progressing to the component CM (see FIG. 3) or emitted from the component CM may be changed. For example, in the case where the component CM includes a camera, an image quality obtained by the camera may be deteriorated or reduced or in the case where the component CM includes a sensor, sensed information may be distorted.

The rear cover layer 20 may include an organic material, for example, a polymer. The polymer may include, for example, an acryl-based resin, an epoxy-based resin, a polyimide, and/or polyethylene.

A thickness of the rear cover layer 20 may not be constant or uniform. A first thickness t of the first portion 21 of the rear cover layer 20 that corresponds to the first area A1 may be less than a second thickness T of the second portion 22 of the rear cover layer 20 that corresponds to the second area A2. The first thickness t and the second thickness T are thicknesses excluding a depth of the dimple D and may be measured, for example, between a dimple D and another dimple D that are adjacent each other.

Though it is shown in FIG. 7A that the rear cover layer 20 entirely covers the rear side of the substrate 100A, the rear cover layer 20 may be located on the rear side of the substrate 100A (e.g., located on only a portion of the rear side of the substrate 100A) and locally located so as to cover the first area A1 (e.g., to cover only the first area A1) as shown in FIG. 7C in another embodiment. For example, the rear cover layer 20 may include only the first portion 21 of the rear cover layer 20 of FIG. 7A described above.

In the case where the rear cover layer 20 entirely covers the rear side of the substrate 100A as described with reference to FIG. 7A, a process thereof may be more simplified compared to a process of the case where the rear cover layer 20 is locally located as shown in FIG. 7C. Hereinafter, an embodiment is described in which the rear cover layer 20 covers not only the first area A1 but also other areas.

Figure 8:
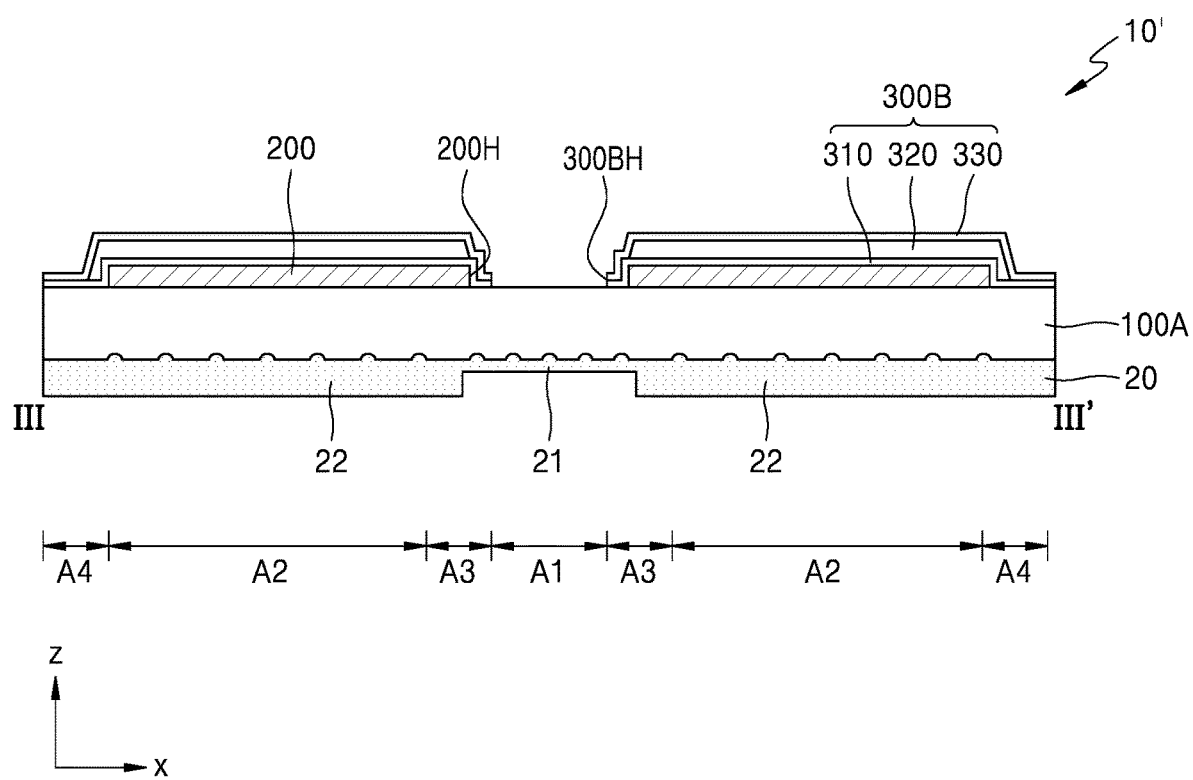
FIG. 8 is a cross-sectional view of a display panel according to an embodiment.
Figure 9:
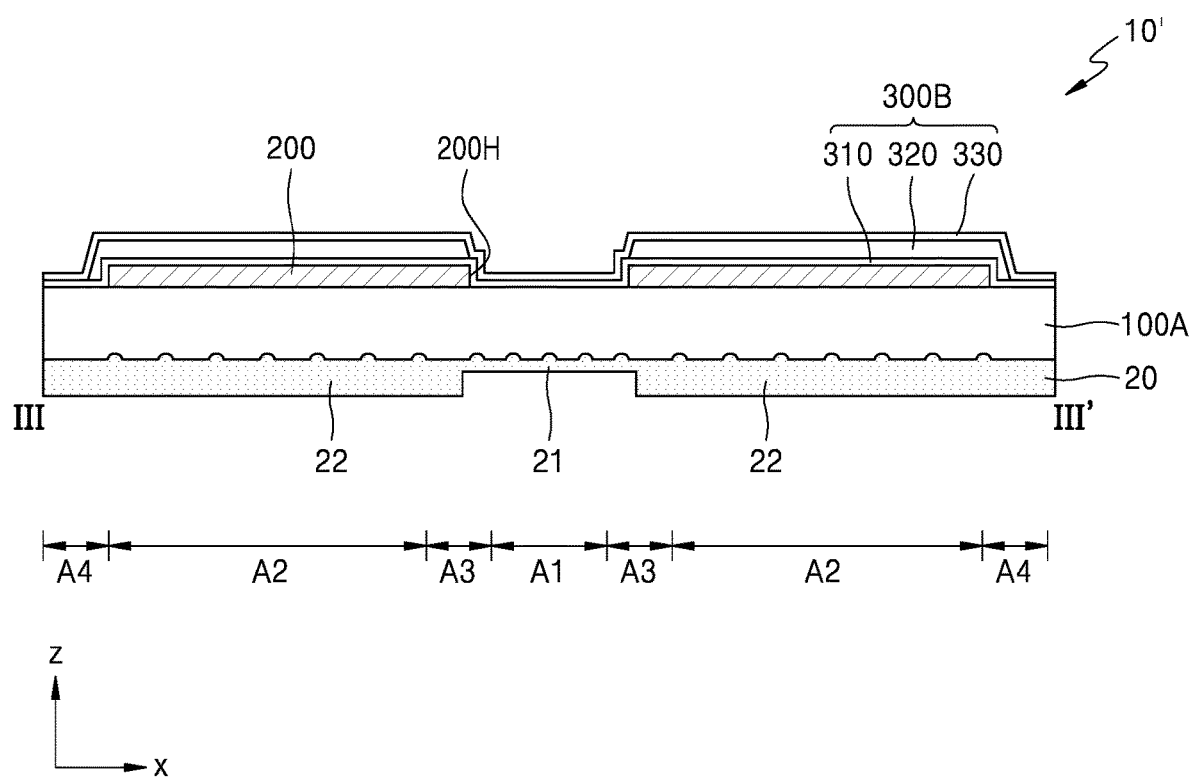
FIG. 9 is a cross-sectional view of a display panel according to an embodiment.

FIGS. 8 and 9 are cross-sectional views of a display panel 10' according to an embodiment taken along line III-III' of FIG. 4.

Referring to FIG. 8, the display panel 10' may include the display layer 200 and the rear cover layer 20, the display layer 200 being on a top surface of the substrate 100A, and the rear cover layer 20 being on the rear side (rear surface) of the substrate 100A as described above with reference to FIG. 7. The rear cover layer 20 may include the first portion 21 and the second portion 22, the first portion 21 corresponding to the first area A1, and the second portion 22 being thicker than the first portion 21. The rear cover layer 20 may include a transparent material in which a difference between a refractive index of the transparent material and a refractive index of the substrate 100A is 0.5 or less, and an example material thereof is the same as that described above. The display layer 200 provided to the display panel 10' of FIG. 8 may be covered by a thin-film encapsulation layer 300B.

The thin-film encapsulation layer 300B may include at least one inorganic encapsulation layer and at least one organic encapsulation layer. In an embodiment, the thin-film encapsulation layer 300B may include first and second inorganic encapsulation layers 310 and 330, and an organic encapsulation layer 320 therebetween.

Each of the first and second inorganic encapsulation layers 310 and 330 may include at least one inorganic insulating material. The inorganic insulating material may include aluminum oxide, titanium oxide, tantalum oxide, hafnium oxide, zinc oxide, silicon oxide, silicon nitride, and/or silicon oxynitride. The organic encapsulation layer 320 may include a polymer-based material. The polymer-based material may include an acryl-based resin, an epoxy-based resin, a polyimide, and/or polyethylene. For example, the organic encapsulation layer 320 may include an acryl-based resin, for example, polymethylmethacrylate and polyacrylic acid.

In the case where the display panel 10' includes the thin-film encapsulation layer 300B as an encapsulation member covering the display layer 200, the display panel 10' may have a thickness less than the thickness of the display panel 10 described above with reference to FIG. 7.

In an embodiment, similarly to the display layer 200 including the fourth hole 200H overlapping the first area A1, the thin-film encapsulation layer 300B may include a fifth hole 300BH overlapping the first area A1. In this case, a transmittance of the first area A1 may be suitably or sufficiently secured. In another embodiment, the thin-film encapsulation layer 300B may not include the fifth hole 300BH as shown in FIG. 9. In an embodiment, the first area A1 may be covered by the first and second inorganic encapsulation layers 310 and 330. Though it is shown in FIG. 9 that the first area A1 is not covered by the organic encapsulation layer 320, the organic encapsulation layer 320 may cover the first area A1 in another embodiment. As described above with reference to FIGS. 2 and 3, in the case where the component does not require a relatively high transmittance, the thin-film encapsulation layer 300B may cover the first area A1.

Figure 10:
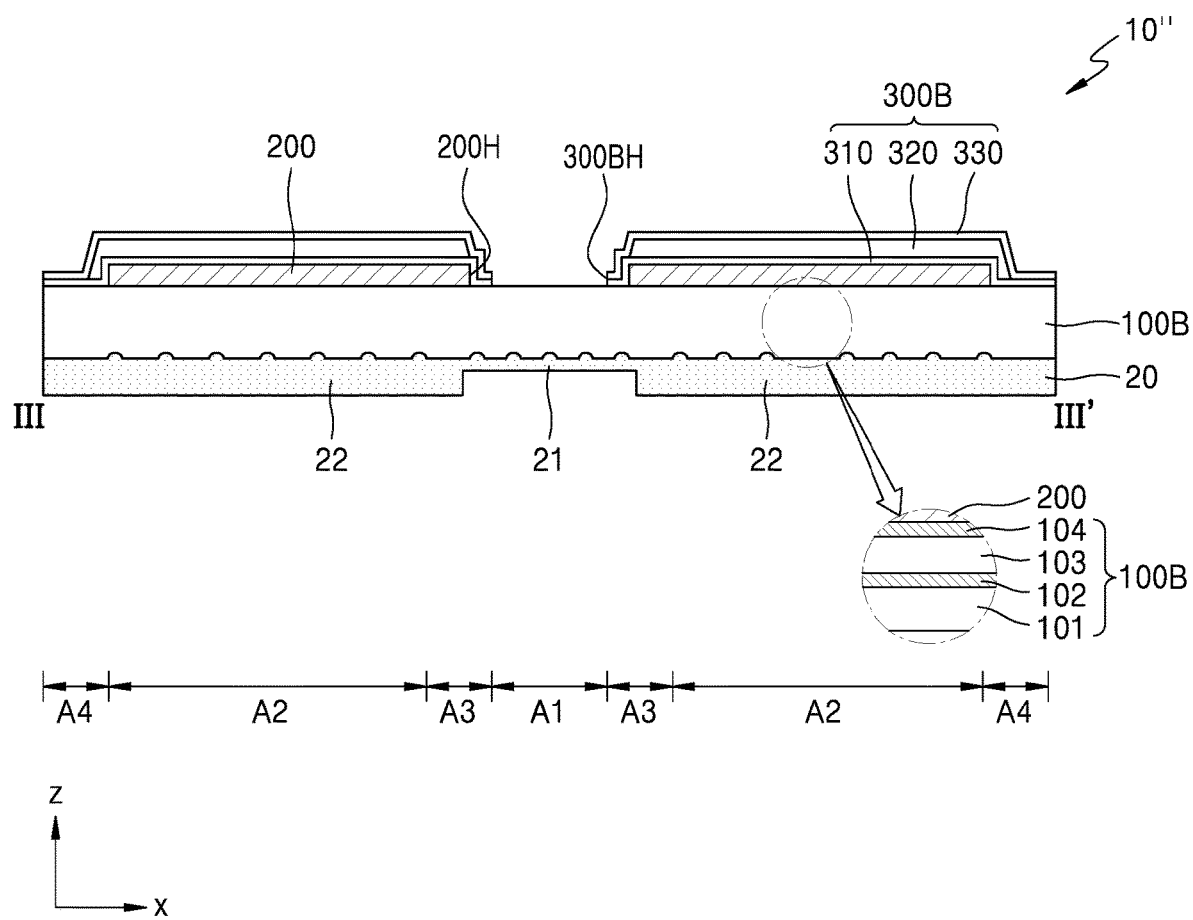
FIG. 10 is a cross-sectional view of a display panel according to an embodiment.
Figure 11:
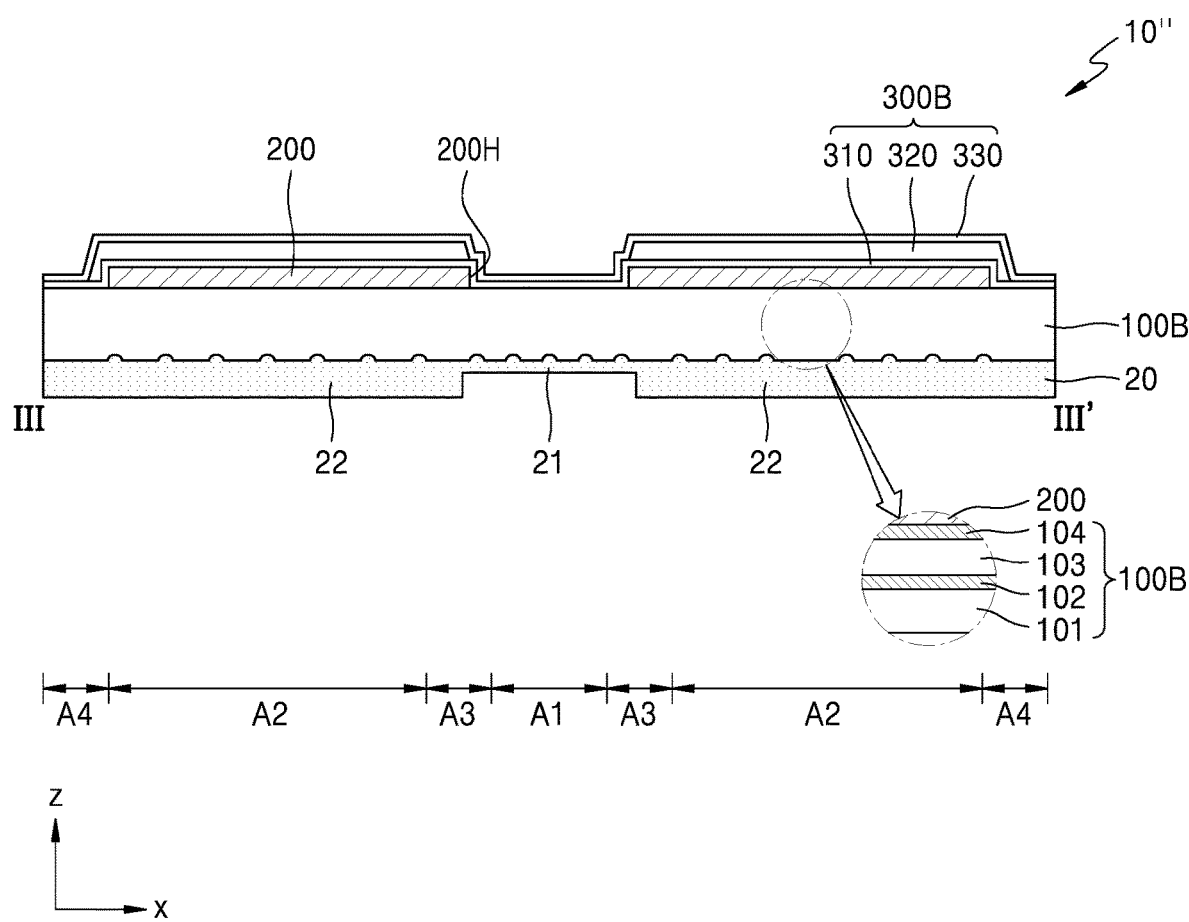
FIG. 11 is a cross-sectional view of a display panel according to an embodiment.

FIGS. 10 and 11 are cross-sectional views of a display panel 10" according to an embodiment, taken along line III-III' of FIG. 4.

Referring to FIG. 10, the display panel 10" may include the display layer 200 and the rear cover layer 20, the display layer 200 being on a top surface of a substrate 100B, and the rear cover layer 20 being on a rear side of the substrate 100B. The display layer 200 provided to the display panel 10" of FIG. 10 may be covered by the thin-film encapsulation layer 300B. For example, the thin-film encapsulation layer 300B may include the first and second inorganic encapsulation layers 310 and 330, and the organic encapsulation layer 320 therebetween. The thin-film encapsulation layer 300B is the same as that described above with reference to FIG. 8.

The substrate 100B may include a polymer resin and include a multi-layer. For example, the substrate 100B may include a first base layer 101, a first barrier layer 102, a second base layer 103, and a second barrier layer 104 that are sequentially stacked.

Each of the first and second base layers 101 and 103 may include a polymer resin. For example, the first and second base layers 101 and 103 may include a polymer resin such as polyethersulfone, polyarylate, polyacrylate, polyetherimide, polyethylene naphthalate, polyethylene terephthalate, polyphenylene sulfide, polyimide, polycarbonate, cellulose tri acetate, and/or cellulose acetate propionate.

The first and second barrier layers 102 and 104 are barrier layers that prevent or reduce the penetration of external foreign substances and may include a single layer or a multi-layer including an inorganic material such as, for example, silicon nitride, silicon oxynitride, and/or silicon oxynitride.

In the case where the substrate 100B of the display panel 10" includes a polymer resin and the thin-film encapsulation layer 300B, the flexibility of the display panel 10" may be improved.

The rear cover layer 20 may be on the rear side of the substrate 100B. The rear cover layer 20 may include the first portion 21 and the second portion 22, the first portion 21 corresponding to the first area A1, and the second portion 22 being thicker than the first portion 21. The rear cover layer 20 may include a transparent material in which a difference between a refractive index of the transparent material and a refractive index of the substrate 100B is 0.5 or less. For example, the rear cover layer 20 may include a material in which a difference between a refractive index of the material and a refractive index of a layer of the substrate 100B is 0.5 or less, the layer of the substrate 100B directly contacting the rear cover layer 20. The rear cover layer 20 may include an organic material, for example, a polymer. The polymer may include, for example, an acryl-based resin, an epoxy-based resin, a polyimide, and/or polyethylene.

The display layer 200 may include pixel circuits and display elements as described above. The display layer 200 may include the fourth hole 200H overlapping the first area A1. The display layer 200 is the same as that described above.

Similar to the display layer 200, the thin-film encapsulation layer 300B may include a fifth hole 300BH overlapping the first area A1 as shown in FIG. 10. In this case, a transmittance of the first area A1 may be suitably or sufficiently secured. In another embodiment, the thin-film encapsulation layer 300B may not include the fifth hole 300BH as shown in FIG. 11. In an embodiment, the first area A1 may be covered by the first and second inorganic encapsulation layers 310 and 330. Though it is shown in FIG. 11 that the first area A1 is not covered by the organic encapsulation layer 320, the organic encapsulation layer 320 may cover the first area A1 in another embodiment. As described above with reference to FIGS. 2 and 3, in the case where the component does not require a relatively high transmittance, the thin-film encapsulation layer 300B may cover the first area A1.

Figure 12:
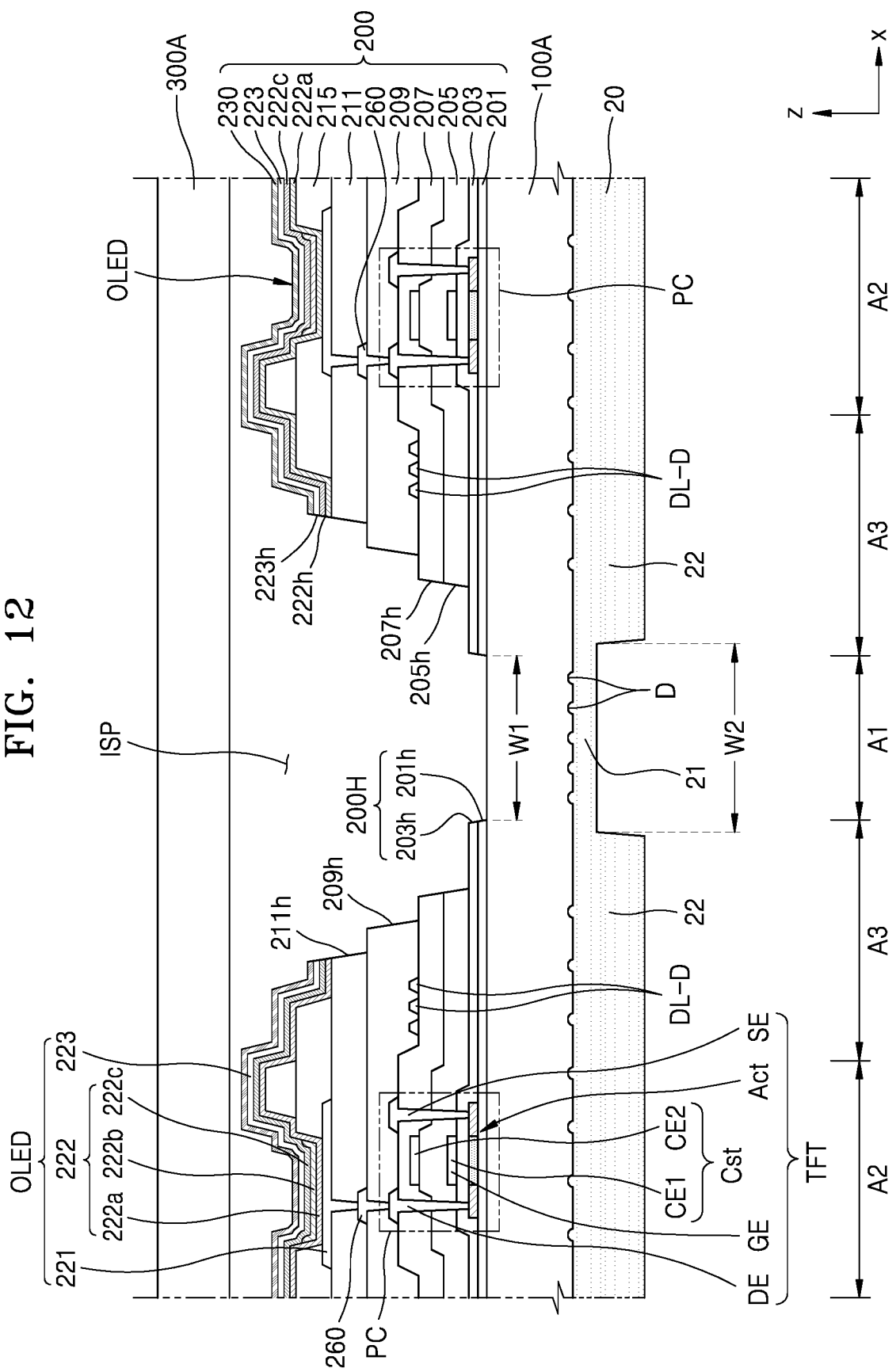
FIG. 12 is a cross-sectional view of a display panel according to an embodiment.

FIG. 12 is a cross-sectional view of the display panel according to an embodiment.

Referring to FIG. 12, a first insulating layer 201, a second insulating layer 203, a third insulating layer 205, a fourth insulating layer 207, a fifth insulating layer 209, and a sixth insulating layer 211 may be on the substrate 100A. The pixel circuit PC may include a thin film transistor TFT and a storage capacitor Cst.

The thin film transistor TFT may include a semiconductor layer Act, a gate electrode GE, a source electrode SE, and a drain electrode DE. The thin film transistor TFT shown in FIG. 12 may be one of the transistors described with reference to FIG. 5, for example, the driving transistor. Though the present embodiment shows a top gate-type thin film transistor in which the gate electrode GE is over the semiconductor layer Act with the second insulating layer 203 therebetween, the thin film transistor may be a bottom gate-type thin film transistor in which the gate electrode GE is below the semiconductor layer Act with the second insulating layer 203 therebetween in another embodiment.

The semiconductor layer Act may include polycrystalline silicon. In some embodiments, the semiconductor layer Act may include amorphous silicon, an oxide semiconductor, or an organic semiconductor. The gate electrode GE may include a low resistance-metal material. The gate electrode GE may include a conductive material including molybdenum (Mo), aluminum (Al), copper (Cu), and/or titanium (Ti) and include a single layer or a multi-layer including the above materials.

The second insulating layer 203 between the semiconductor layer Act and the gate electrode GE may include an inorganic insulating material such as, for example, silicon oxide, silicon nitride, silicon oxynitride, aluminum oxide, titanium oxide, tantalum oxide, and/or hafnium oxide. The second insulating layer 203 may include a single layer or a multi-layer including the above materials.

The source electrode SE and the drain electrode DE may include a material having excellent conductivity (electrical conductivity). The source electrode SE and the drain electrode DE may include a conductive material including molybdenum (Mo), aluminum (Al), copper (Cu), and/or titanium (Ti) and include a single layer or a multi-layer including the above materials. In an embodiment, the source electrode SE and the drain electrode DE may include a multi-layer of Ti/Al/Ti.

A storage capacitor Cst may include a bottom electrode CE1 and a top electrode CE2 overlapping each other and having the third insulating layer 205 therebetween. The storage capacitor Cst may overlap the thin film transistor TFT. With regard to this feature, FIG. 12 shows that the gate electrode GE of the thin film transistor TFT serves as the bottom electrode CE1 of the storage capacitor Cst. In another embodiment, the storage capacitor Cst may not overlap the thin film transistor TFT. The storage capacitor Cst may be covered by the fourth insulating layer 207.

The third insulating layer 205 and the fourth insulating layer 207 may include an inorganic insulating material such as, for example, silicon oxide, silicon nitride, silicon oxynitride, aluminum oxide, titanium oxide, tantalum oxide, and/or hafnium oxide. The third insulating layer 205 and the fourth insulating layer 207 may include a single layer or a multi-layer including the above materials.

A pixel circuit PC including the thin film transistor TFT and the storage capacitor Cst may be covered by the fifth insulating layer 209. The fifth insulating layer 209 is a planarization insulating layer and may include an approximately flat top surface. The fifth insulating layer 209 may include an organic insulating material including a general-purpose polymer such as, for example, polymethylmethacrylate (PMMA) and/or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof. In an embodiment, the fifth insulating layer 209 may include polyimide.

A contact metal 260 may be formed on the fifth insulating layer 209. The contact metal 260 may include a conductive material including molybdenum (Mo), aluminum (Al), copper (Cu), and/or titanium (Ti) and include a single layer or a multi-layer including the above materials. The contact metal 260 may include the same material as that of the source electrode SE or the drain electrode DE of the thin film transistor TFT. For example, the contact metal 260 may include a multi-layer of Ti/Al/Ti.

The sixth insulating layer 211 may be formed on the contact metal 260. The sixth insulating layer 211 may include an approximately flat top surface. The sixth insulating layer 211 may include an organic insulating material including a general-purpose polymer such as, for example, polymethylmethacrylate (PMMA) and/or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof. In an embodiment, the sixth insulating layer 211 may include polyimide. Though not shown, an inorganic insulating layer may be further between the fifth insulating layer 209 and the sixth insulating layer 211.

The pixel electrode 221 may be formed on the sixth insulating layer 211. The pixel electrode 221 may include a conductive oxide such as, for example, indium tin oxide (ITO), zinc oxide (IZO), zinc oxide (ZnO), indium oxide ($In_2O_3$), indium gallium oxide (IGO), and/or aluminum zinc oxide (AZO). In another embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), and/or a compound thereof. In another embodiment, the pixel electrode 221 may further include a layer including ITO, IZO, ZnO, and/or $In_2O_3$ that is on and/or under the reflective layer.

A pixel-defining layer 215 may be formed on the pixel electrode 221. The pixel-defining layer 215 may include an opening that exposes a top surface of the pixel electrode 221 and cover edges or periphery of the pixel electrode 221. The pixel-defining layer 215 may include an organic insulating material. In some embodiments, the pixel-defining layer 215 may include an inorganic insulating material such as, for example, silicon oxide, silicon nitride, and/or silicon oxynitride. In some embodiments, the pixel-defining layer 215 may include an organic insulating material and an inorganic insulating material.

An intermediate layer 222 may include an emission layer 222b. The emission layer 222b may include, for example, an organic material. The emission layer 222b may include a polymer organic material and/or a low molecular weight organic material that emits light of a set or predetermined color. The intermediate layer 222 may include a first functional layer 222a under the emission layer 222b and/or a second functional layer 222c on the emission layer 222b.

The first functional layer 222a may include a single layer or a multi-layer. For example, in the case where the first functional layer 222a includes a polymer material, the first functional layer 222a may be a hole transport layer (HTL) which has a single-layered structure. The first functional layer 222a may include poly-(3,4)-ethylene-dihydroxy thiophene (PEDOT) and/or polyaniline (PANI). In the case where the first functional layer 222a includes a low molecular weight material, the first functional layer 222a may include a hole injection layer (HIL) and/or a hole transport layer (HTL).

The second functional layer 222c may be omitted. For example, in the case where the first functional layer 222a and the emission layer 222b include a polymer material, the second functional layer 222c may be formed. The second functional layer 222c may include a single layer or a multi-layer. The second functional layer 222c may include an electron transport layer (ETL) and/or an electron injection layer (EIL).

The emission layer 222b of the intermediate layer 222 may be arranged for (e.g., to correspond with) each pixel in the second area A2. The emission layer 222b may overlap the opening of the pixel-defining layer 215 and/or the pixel electrode 221. The first and second functional layers 222a and 222c of the intermediate layer 222 are single bodies and may be provided in not only the second area A2 but also the third area A3.

An opposite electrode 223 may include a conductive material having a low work function. For example, the opposite electrode 223 may include a (semi) transparent layer including Ag, Mg, Al, Ni, Cr, lithium (Li), calcium (Ca), and/or an alloy thereof. In some embodiments, the opposite electrode 223 may further include a layer including ITO, IZO, ZnO, and/or $In_2O_3$ on and/or under the (semi) transparent layer including the above material. The opposite electrode 223 is a single body and may cover a plurality of pixel electrodes 221 in the second area A2. In an embodiment, the opposite electrode 223 may include Ag and Mg.

A capping layer 230 may be on the opposite electrode 223. The capping layer 230 may include a LiF layer, an inorganic material layer, and/or an organic material layer. In an embodiment, the capping layer 230 may be omitted.

A stacked body located in the opening of the pixel-defining layer 215 may correspond to an organic light-emitting diode OLED. The stacked body may include the pixel electrode 221, the intermediate layer 222, and the opposite electrode 223. Two pixels, for example, two organic light-emitting diodes OLED and two pixel circuits PC may be spaced apart from each other and have the first area A1 therebetween. The organic light-emitting diodes OLED are in the second area A2. The display layer 200 may include a wiring in the third area A3. In an embodiment, FIG. 12 shows the third portion DL-D (see FIG. 6) of the data line DL that detours, in the third area A3, along a portion of the edge or periphery of the first area A1.

The display layer 200 may include the fourth hole 200H located in the first area A1. The fourth hole 200H may be formed while through holes respectively formed in the insulating layers of the display layer 200 overlap each other. The insulating layers of the display layer 200, for example, the first insulating layer 201, the second insulating layer 203, the third insulating layer 205, the fourth insulating layer 207, the fifth insulating layer 209, the sixth insulating layer 211, and the pixel-defining layer 215 may respectively include through holes 201h, 203h, 205h, 207h, 209h, and 211h each located in the first area A1. As described above, the opposite electrode 223 may be provided as one body over the substrate 100A and may include a through hole 223h located in the first area A1. Some of the intermediate layer 222, for example, the first and second functional layers 222a and 222c may be provided as one bodies (e.g., unibodies or monoliths) and may include a through hole 222h located in the first area A1.

The fourth hole 200H may be defined by an insulating layer that defines a hole having a small size among the insulating layers of the display layer 200. In an embodiment, it is shown in FIG. 12 that the fourth hole 200H is defined by lateral surfaces of the first and second insulating layers 201 and 203 that define the through holes 201h and 203h of the first and second insulating layers 201 and 203.

The encapsulation substrate 300A faces the substrate 100A. In the first area A1, there may be no material included in the display layer 200 between a bottom surface of the encapsulation substrate 300A and a top surface of the substrate 100A. For example, there may be air, a gas (e.g., an inert gas), or a vacuum in an inner space ISP between the substrate 100A and the encapsulation substrate 300A. In some embodiments, there may be only an air layer between the substrate 100A and the encapsulation substrate 300A in the first area A1, there may be only a transparent material layer in the inner space ISP between the substrate 100A and the encapsulation substrate 300A in the first area A1. The transparent material layer may include a liquid transparent material. In an embodiment, the liquid transparent material may include an organic material and/or an inorganic material having a refractive index similar to or substantially the same as refractive indexes of the substrate 100A and the encapsulation substrate 300A. A difference between the refractive index of the liquid transparent material and the refractive indexes of the substrate 100A and the encapsulation substrate 300A may be 0.5 or less. In an embodiment, the transparent material layer may include epoxy, urethane acrylate, epoxy acrylate and/or a silicon-based resin (e.g. bisphenol A-type epoxy (e.g., an epoxy including or made from bisphenol A or a derivative thereof), a cycloaliphatic epoxy resin, a phenyl silicon resin and/or rubber, an acrylic epoxy resin, aliphatic urethane acrylate, etc.). In some embodiments, silicon and/or silicon oils in which a phase thereof does not change and which have a volume change rate of 5% or less in the temperature range of about −40° C. to about 100° C. may be used. For example, one of hexamethyldisiloxane, octamethyltrisiloxane, decamethyltetrasiloxane, dodecamethylpentasiloxane, and/or polydimethylsiloxanes may be used.

There may be a plurality of dimples D in the rear side of the substrate 100A, and the dimples D may be filled with a material of the rear cover layer 20. The rear cover layer 20 may include a material in which a difference between a refractive index of the material and a refractive index of the substrate 100A is 0.5 or less. An example material thereof is the same as that described above.

A thickness of the first portion 21 of the rear cover layer 20 located in the first area A1 may be less than a thickness of the second portion 22 of the rear cover layer 20 located in the other area. The first portion 21 and the second portion 22 may constitute a step difference. A width W2 of the first portion 21 may be equal to or greater than a width of the fourth hole 200H of the display layer 200, for example, a width W1 of the through hole 201h of the first insulating layer 201.

Figure 13:
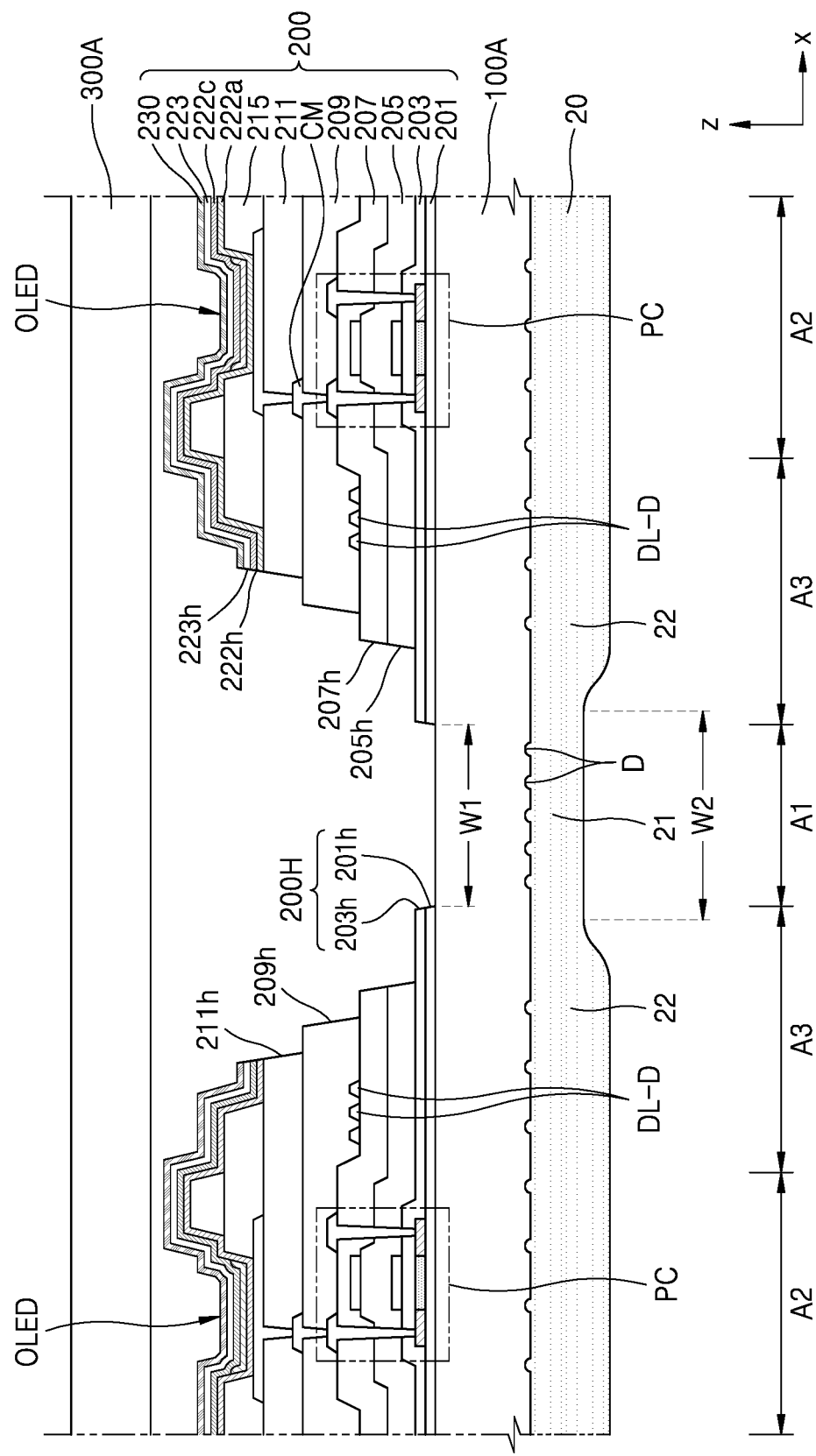
FIG. 13 is a cross-sectional view of a display panel according to an embodiment.

FIG. 13 is a cross-sectional view of the display panel according to an embodiment.

Referring to FIG. 13, because various characteristics including example structures of the substrate 100A, the display layer 200, and the encapsulation substrate 300A, and a structure in which an air layer or a transparent material layer is between the substrate 100A and the encapsulation substrate 300A in the first area A1 are the same as those of the display panel described above with reference to FIG. 12, the rear cover layer 20 is mainly described below.

The rear cover layer 20 includes the first portion 21 located in the first area A1, and a thickness of the first portion 21 is less than a thickness of the second portion 22 located in the other area. The width W2 of the first portion 21 may be equal to or greater than the width of the fourth hole 200H of the display layer 200, for example, the width W1 of the through hole 201h of the first insulating layer 201.

There may be a step difference between the first portion 21 and the second portion 22, and the step difference may have an inclination surface in a cross-sectional view. For example, a thickness of a step difference portion located between the first portion 21 and the second portion 22 may increase in a direction from the first portion 21 and the second portion 22. The inclination surface may have a slope of less than 90° with respect to the rear side of the substrate 100A and/or include a curved surface. A thickness of the first portion 21 is less than a thickness of the second portion 22. The second portion 22 may be defined as a portion having a thickness of about 120% or less of the thickness of the center of the first portion 21 or a portion having a thickness of about 115% or less of the thickness of the center of the first portion 21. The width W2 of the first portion 21 may be equal to or greater than the width W1 of the through hole 201h.

A step difference structure between the first portion 21 and the second portion 22 of the rear cover layer 20 described above may be formed by using a mask shown in FIG. 14.

Figure 14:
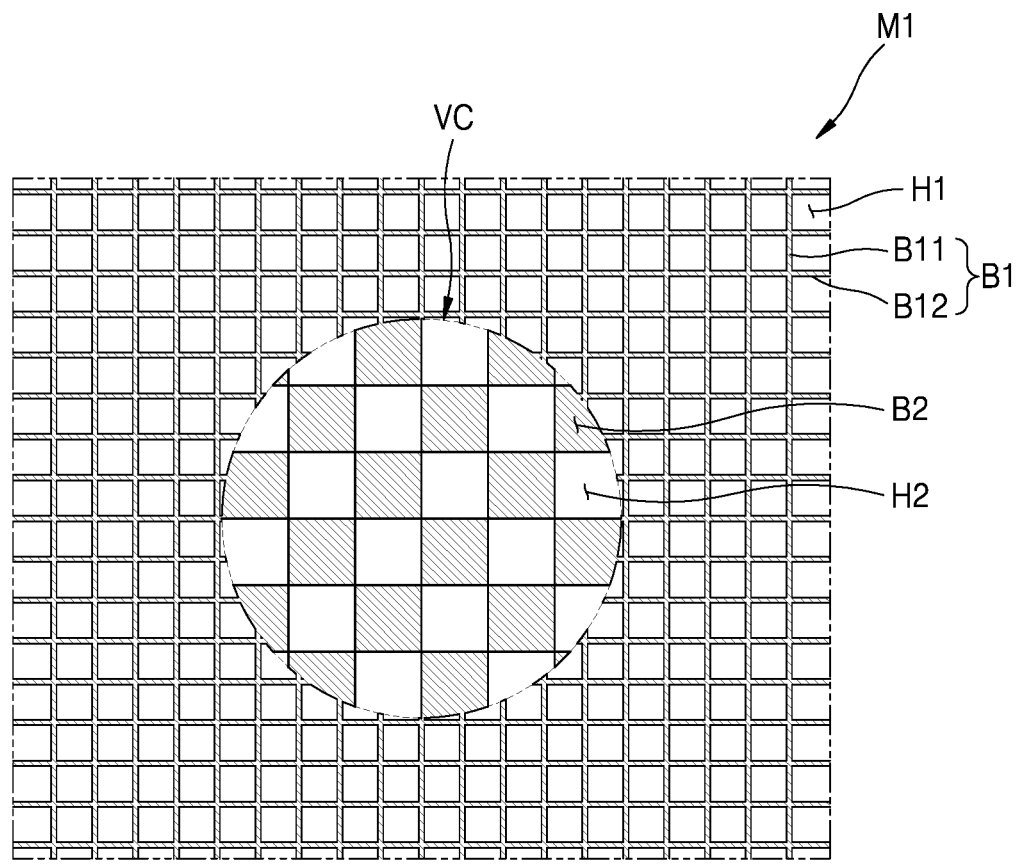
FIG. 14 is a plan view of a mask for forming a rear cover layer according to an embodiment.

FIG. 14 is a plan view of a mask M1 for forming the rear cover layer 20 according to an embodiment.

Referring to FIG. 14, the mask M1 may include a first hiding portion B1, the first hiding portion (or a shielding portion) B1 including a first rib B11 and a second rib B12 respectively extending in an x-direction and a y-direction. A plurality of first ribs B11 and a plurality of second ribs B12 may cross each other to constitute a mesh structure, and the mask M1 may include a plurality of first holes H1 located between neighboring ribs. The mask M1 may include a second hole H2 in a set or predetermined area, for example, inside a virtual circle VC. A size of the second hole H2 may be greater than a size of the first hole H1. Unlike the first holes H1 adjacent in the y-direction and the x-direction, a second hiding portion B2 may be located between the second holes H2 that neighbor each other (e.g., are adjacent to each other), the second hiding portion B2 having substantially the same size as that of the second hole H2. The second hole H2 and the second hiding portion B2 may be alternately arranged in the x-direction and the y-direction.

The rear cover layer 20 described above with reference to FIG. 13 may be formed by a screen printing method that uses the mask M1. For example, the mask M1 having the above structure is on the rear side of the substrate 100A described with reference to FIG. 13, and then an organic material constituting (e.g., for forming) the rear cover layer 20 may be coated. The organic material that passes through the first holes H1 may constitute (e.g., form) the second portion 22 (see FIG. 13), and the organic material that passes through the second holes H2 may constitute (e.g., form) the first portion 21 (see FIG. 13). An amount of the organic material that passes through the second holes H2 through the second hiding portion B2 having a relatively large size may be less than an amount of the organic material that passes through the first holes H1. Therefore, the rear cover layer 20 having the first portion 21 and the second portion 22 may be formed, the first portion 21 having a relatively small thickness, and the second portion 22 having a relatively large thickness. Because the organic material has fluidity before the organic material is hardened, the step difference between the first portion 21 and the second portion 22 may have the inclination surface having a curved surface due to a leveling phenomenon of the organic material as shown in FIG. 13.

In another embodiment, as shown in FIG. 12, a structure in which the inclination surface of the step difference between the first portion 21 and the second portion 22 has an inclination of substantially 90° may be formed by a method of coating the organic material and then removing a portion of the organic material.

Though it is shown in FIGS. 12 and 13 that the first portion 21 is coupled to the second portion 22, the first portion 21 may be spaced apart from the second portion 22 in another embodiment.

Figure 15:
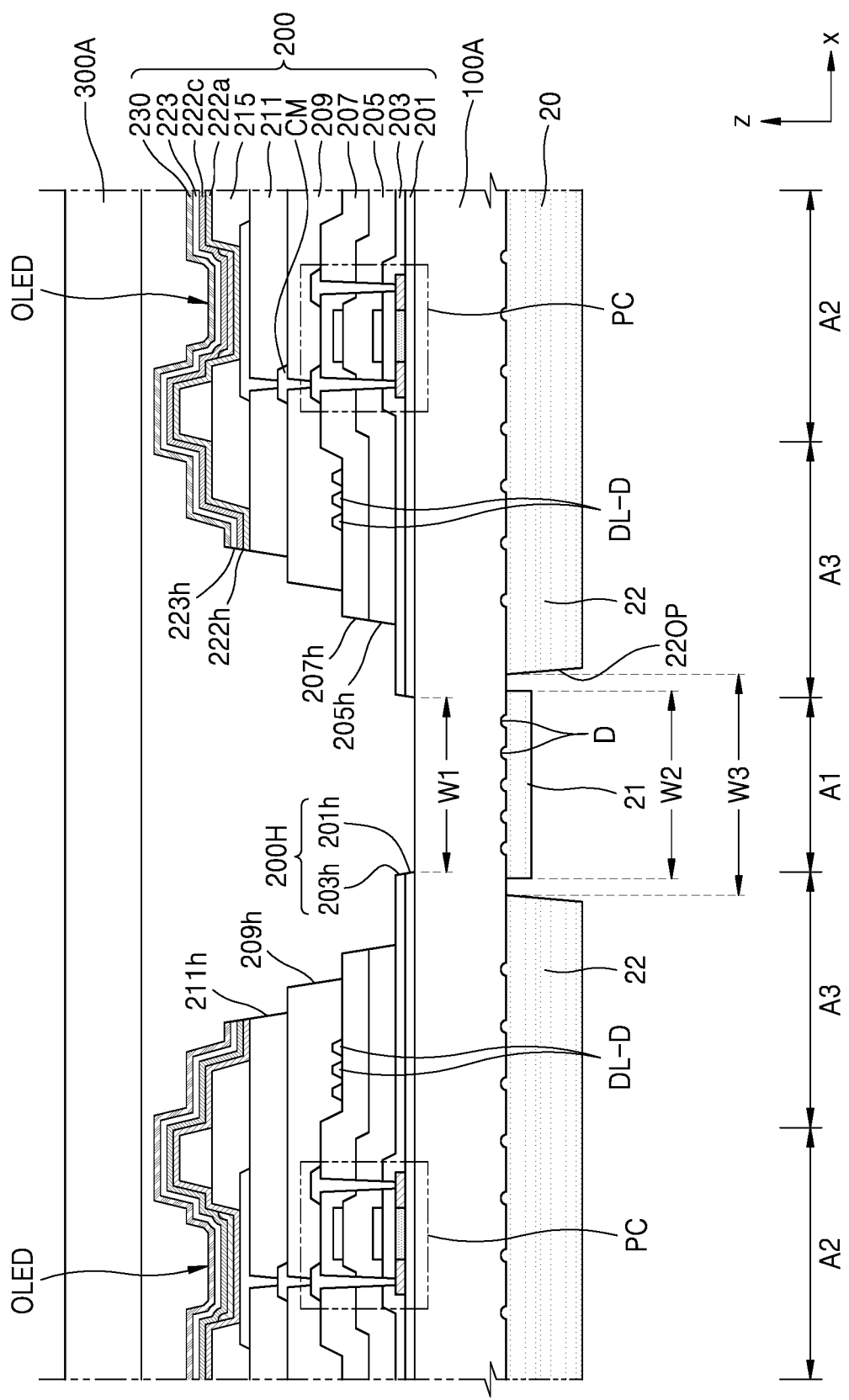
FIG. 15 is a cross-sectional view of a display panel according to an embodiment.

FIG. 15 is a cross-sectional view of the display panel according to an embodiment.

Referring to FIG. 15, because various characteristics including example structures of the substrate 100A, the display layer 200, and the encapsulation substrate 300A, and a structure in which an air layer or a transparent material layer is between the substrate 100A and the encapsulation substrate 300A are the same as those of the display panel described above with reference to FIG. 12, the rear cover layer 20 is mainly described below.

The rear cover layer 20 includes the first portion 21 located in the first area A1, and a thickness of the first portion 21 is less than a thickness of the second portion 22 located in the other area (e.g., in an area other than the first area A1). The width W2 of the first portion 21 may be equal to or greater than the width of the fourth hole 200H of the display layer 200, for example, the width W1 of the through hole 201h of the first insulating layer 201.

There may be a step difference between the first portion 21 and the second portion 22. The first portion 21 may be spaced apart from the second portion 22. For example, the second portion 22 may include an opening area 220P corresponding to the first area A1, and the first portion 21 may be located in the opening area 220P. A width W3 of the opening area 220P may be greater than the width W2 of the first portion 21.

The first portion 21 and the second portion 22 may include the same or substantially the same material. As described above, the rear cover layer 20 including the first portion 21 and the second portion 22 respectively having different thicknesses may be formed by using a mask shown in FIG. 16.

Figure 16:
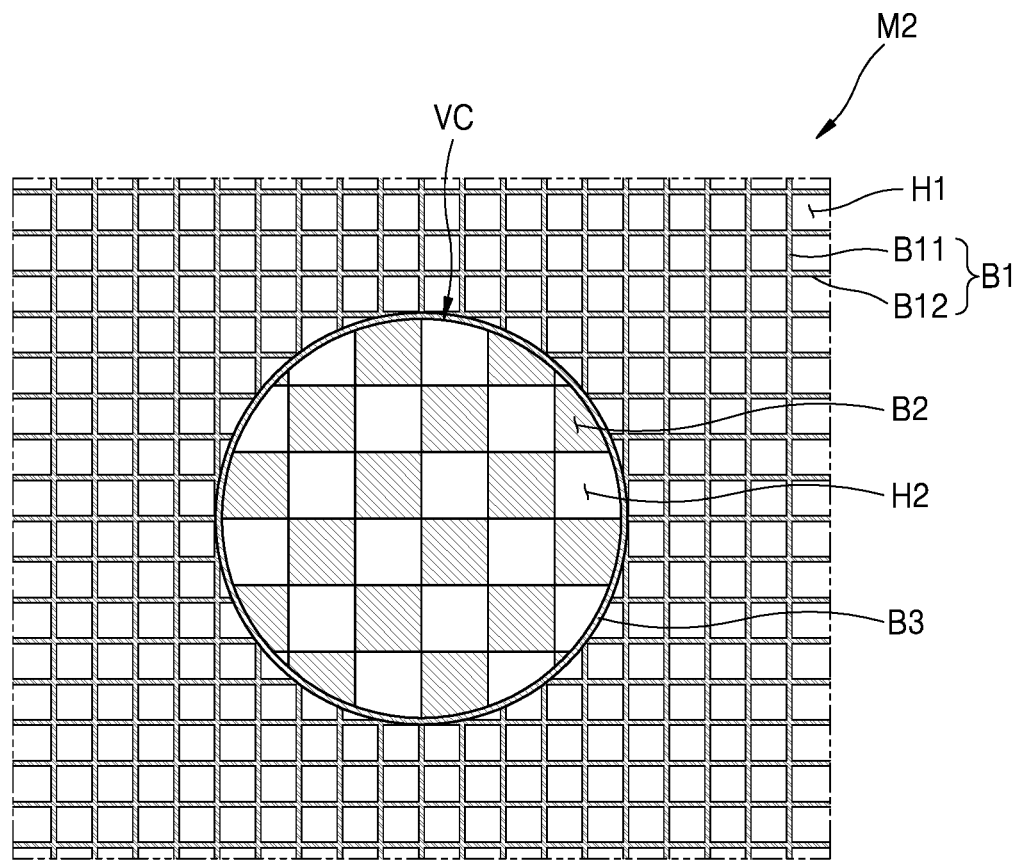
FIG. 16 is a plan view of a mask for forming a rear cover layer according to an embodiment.

FIG. 16 is a plan view of a mask M2 for forming the rear cover layer 20 according to an embodiment.

Referring to FIG. 16, the mask M2 may include a first hiding portion B1, the first hiding portion B1 including first ribs B11 and second ribs B12 respectively extending in the x-direction and the y-direction. The plurality of first ribs B11 and the plurality of second ribs B12 may constitute (e.g., form) a mesh structure, and the mask M2 may include a plurality of first holes H1 located between neighboring ribs.

The mask M2 may include second holes H2 in a set or predetermined area, for example, inside a virtual circle VC. A size of the second hole H2 may be greater than a size of the first hole H1. Unlike the first holes H1 adjacent in the y-direction and the x-direction, the second holes H2 may include a second hiding portion B2 having substantially the same size as that of the second hole H2 between the second holes H2 that neighbor each other (e.g., are adjacent to or nearest to each other). The second hole H2 and the second hiding portion B2 may be alternately arranged in the x-direction and the y-direction.

The mask M2 may include a third hiding portion B3 having a ring shape that extends in a peripheral (e.g., circumferential) direction corresponding to the virtual circle VC. The second holes H2 and the second hiding portions B2 may be alternately inside the third hiding portion B3.

The rear cover layer 20 described above with reference to FIG. 15 may be formed by a screen printing method that uses the mask M2. For example, the mask M2 having the structure shown in FIG. 16 is on the rear side of the substrate 100A (see FIG. 15) in which the dimples are formed and then an organic material constituting the rear cover layer 20 may be coated. The organic material that passes through the first holes H1 may constitute (e.g., form) the second portion 22 (see FIG. 15), and the organic material that passes through the second holes H2 may constitute (e.g., form) the first portion 21 (see FIG. 15). A separation space may be formed between the first portion 21 and the second portion 22 by the third hiding portion B3.

Figure 17:
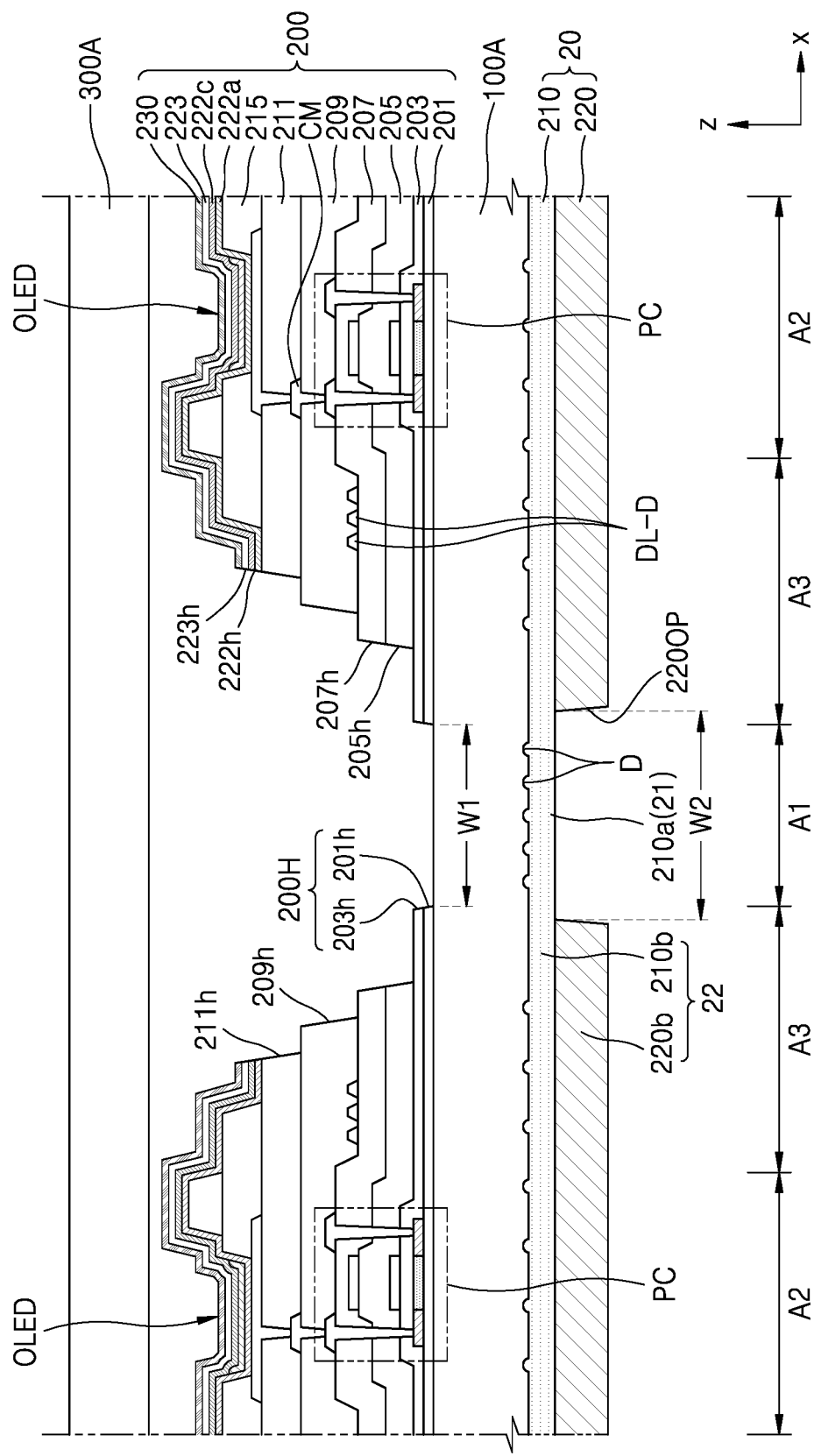
FIG. 17 is a cross-sectional view of a display panel according to an embodiment.

FIG. 17 is a cross-sectional view of the display panel according to an embodiment.

Referring to FIG. 17, because various characteristics including example structures of the substrate 100A, the display layer 200, and the encapsulation substrate 300A, and a structure in which an air layer or a transparent material layer is between the substrate 100A and the encapsulation substrate 300A are the same as those of the display panel described above with reference to FIG. 12, the rear cover layer 20 is mainly described below.

The rear cover layer 20 may include a first sub-layer 210 and a second sub-layer 220, the first sub-layer 210 filling the dimples D while directly contacting (e.g., physically contacting) the rear side of the substrate 100A, and the second sub-layer 220 contacting the first sub-layer 210. The first sub-layer 210 may be located between the substrate 100A and the second sub-layer 220.

The rear cover layer 20 may include different kinds of materials. The first sub-layer 210 may include a material having a relatively small viscosity and include a transparent material in which a difference between a refractive index of the substrate 100A and a refractive index of the transparent material is 0.5 or less. For example, the first sub-layer 210 may include an organic material.

The second sub-layer 220 may include a material having a viscosity greater than that of the first sub-layer 210. A thickness of the second sub-layer 220 having a high viscosity may be 2.5 times or more the thickness of the first sub-layer 210, for example, three times the thickness of the first sub-layer 210. The second sub-layer 220 may include an organic material and particles (e.g. silicon oxide and titanium oxide) dispersed in the organic material. A transmittance (e.g., a light transmittance) of the second sub-layer 220 including the particles may be less than a transmittance of the first sub-layer 210. The second sub-layer 220 may include an opening 2200P corresponding to the first area A1. Therefore, a transmittance (e.g., a light transmittance) of the first area A1 may be suitably or sufficiently secured.

The first portion 21 of the rear cover layer 20 located in the first area A1 may correspond to a portion 210a of the first sub-layer 210 that overlaps the opening 2200P of the second sub-layer 220. The second portion 22 of the rear cover layer 20 may correspond to a portion 210b of the first sub-layer 210 and a portion 220b of the second sub-layer 220, the portion 210b overlapping the portion 220b.

The width W2 of the first portion 21 may be defined by a width of the opening 2200P of the second sub-layer 220. The width W2 of the first portion 21 may be equal to or greater than the width of the fourth hole 200H of the display layer 200, for example, the width W1 of the through hole 201h of the first insulating layer 201.

Figure 18:
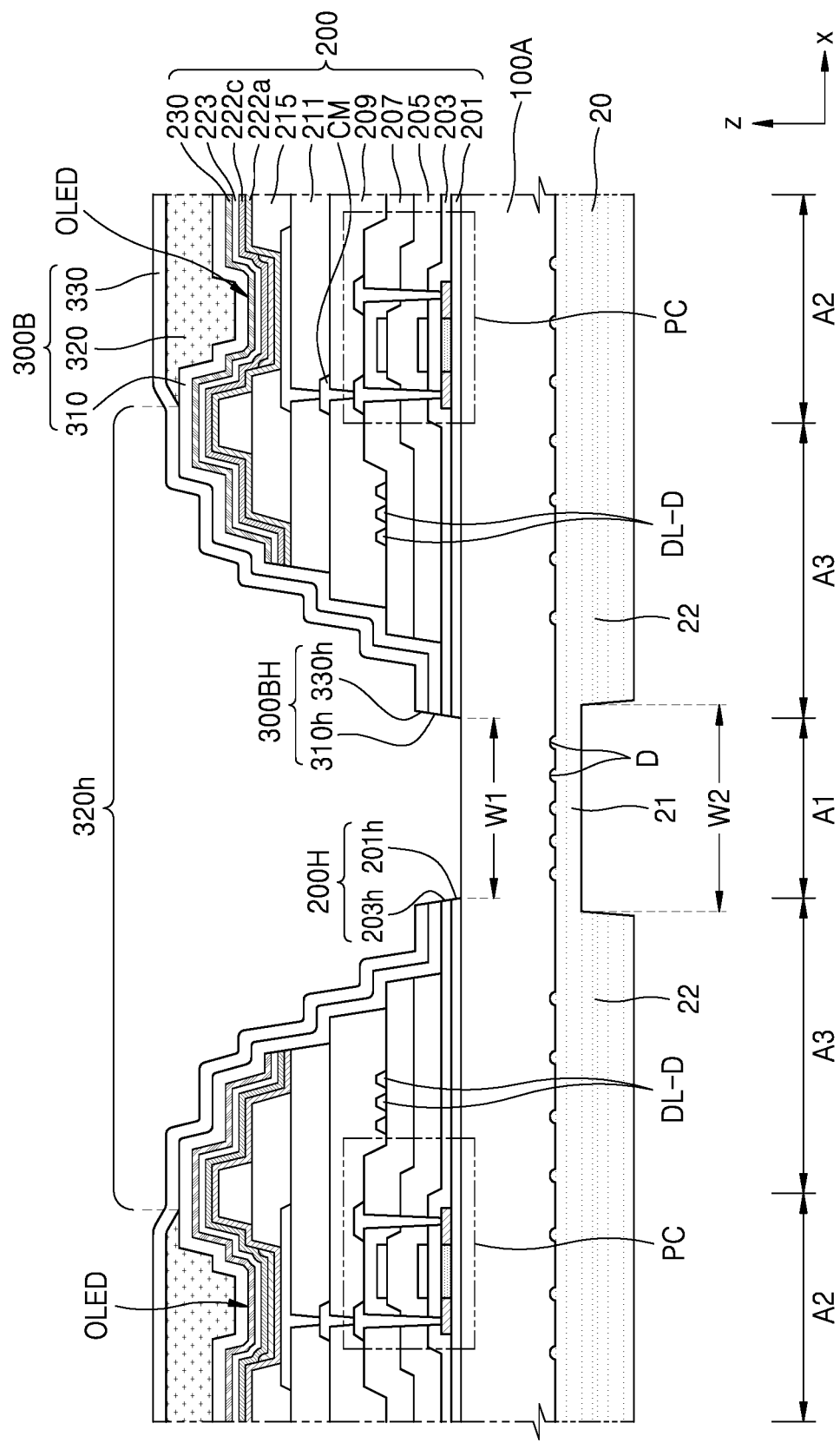
FIG. 18 is a cross-sectional view of a display panel according to an embodiment.

FIG. 18 is a cross-sectional view of the display panel according to an embodiment.

Referring to FIG. 18, the display layer 200 is on the substrate 100A, the display layer 200 including the pixel circuit PC and the organic light-emitting diode OLED. An example structure thereof is the same as that described with reference to FIG. 12. The display layer 200 may be covered by the thin-film encapsulation layer 300B.

The thin-film encapsulation layer 300B may include at least one inorganic encapsulation layer and at least one organic encapsulation layer. In an embodiment, the thin-film encapsulation layer 300B may include the first and second inorganic encapsulation layers 310 and 330, and the organic encapsulation layer 320 therebetween. The first and second inorganic encapsulation layers 310 and 330 and the organic encapsulation layer 320 may include the same material as described herein above.

The thin-film encapsulation layer 300B may include the fifth hole 300BH as described above with reference to FIG. 8. In an embodiment, the first and second inorganic encapsulation layers 310 and 330 may respectively include holes 310h and 330h corresponding to the first area A1. The fifth hole 300BH of the thin-film encapsulation layer 300B may be defined by the holes 310h and 330h, each of the holes 310h and 330h passing through the first and second inorganic encapsulation layers 310 and 330, respectively. The organic encapsulation layer 320 may include a hole 320h having a size greater than sizes of the holes 310h and 330h, respectively, of the first and second inorganic encapsulation layers 310 and 330.

End portions of the first and second inorganic encapsulation layers 310 and 330 that neighbor the first area A1 may overlap the inorganic insulating layers of the display layer 200, for example, the first insulating layer 201 and the second insulating layer 203. The first and second inorganic encapsulation layers 310 and 330 may directly contact (e.g., physically contact) the first and second insulating layers 201 and 203.

The fourth hole 200H of the display layer 200 may be defined by the hole of the insulating layer that has a smallest width among the insulating layers of the display layer 200. In an embodiment, it is shown in FIG. 18 that the fourth hole 200H of the display layer 200 is defined by the holes 201h and 203h, respectively, of the first and second insulating layers 201 and 203.

The fifth hole 300BH of the thin-film encapsulation layer 300B may have substantially the same size or width as that of the fourth hole 200H of the display layer 200. In some embodiments, the fifth hole 300BH of the thin-film encapsulation layer 300B may be less than or greater than the fourth hole 200H of the display layer 200.

The width W1 of a smaller one selected from the width of the fourth hole 200H of the display layer 200 and the width of the fifth hole 300BH of the thin-film encapsulation layer 300B may be equal to or less than the width W2 of the first portion 21 of the rear cover layer 20. In an embodiment, FIG. 18 shows that the first width W1 is defined by the fourth hole 200H of the display layer 200. However, in some embodiments, the first width W1 is defined by the fifth hole 300BH of the thin-film encapsulation layer 300B.

The rear cover layer 20 may include the first portion 21 and the second portion 22 and cover the dimples D formed in the rear side of the substrate 100A. Characteristics of the rear cover layer 20 are the same as that described above with reference to FIG. 12. Though it is shown in FIG. 18 that the rear cover layer 20 has the structure shown in FIG. 12, the present disclosure is not limited thereto. In another embodiment, the rear cover layer 20 may have the structure described with reference to FIGS. 13, 15, and 17. In another embodiment, the rear cover layer 20 may be locally located so as to cover the first area A1 as described with reference to FIG. 7C.

Figure 19:
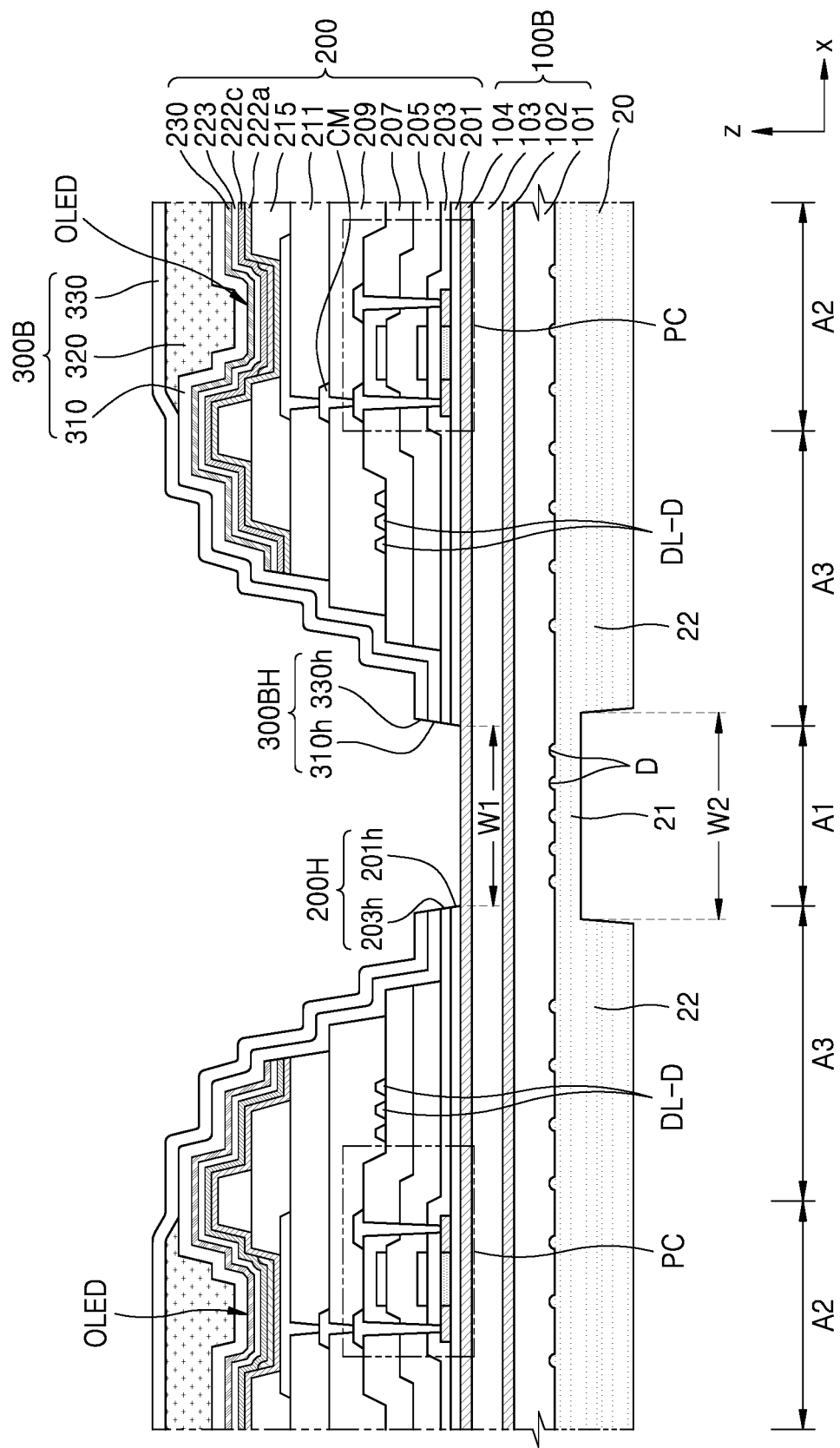
FIG. 19 is a cross-sectional view of a display panel according to an embodiment.
Figure 20:
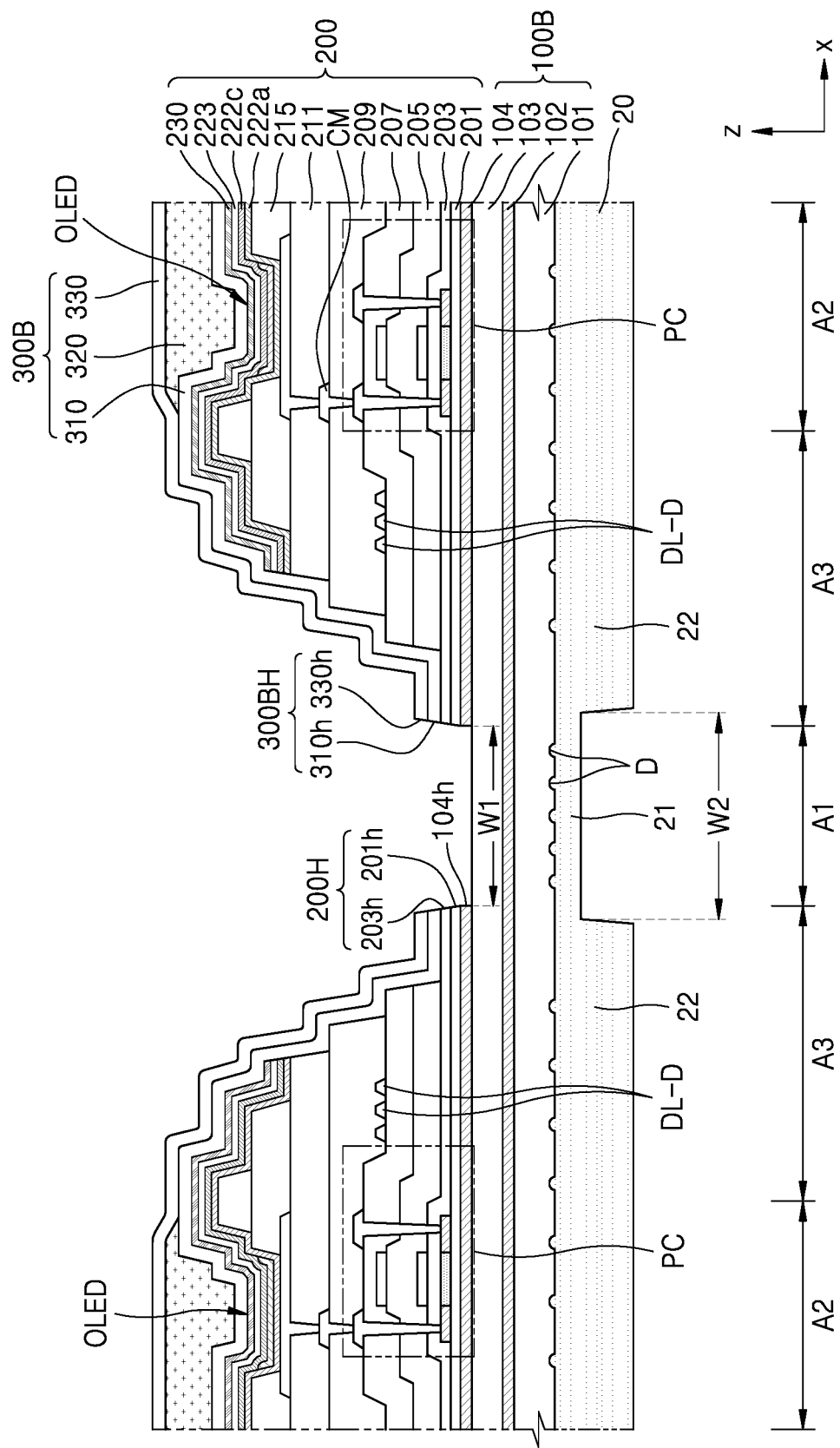
FIG. 20 is a cross-sectional view of a display panel according to an embodiment.

FIGS. 19 and 20 are cross-sectional views of the display panel according to an embodiment.

Referring to FIG. 19, the display layer 200 is on the substrate 100B, the display layer 200 including the pixel circuit PC and the organic light-emitting diode OLED. The display layer 200 may be covered by the thin-film encapsulation layer 300B. Though it is shown in FIG. 18 that the display layer 200 and the thin-film encapsulation layer 300B are formed on a top surface of the substrate 100, which is a single layer, and the rear cover layer 20 is formed on the rear side of the substrate 100A, it is shown in FIGS. 19 and 20 that the substrate 100B includes a plurality of layers. Example structures of the display layer 200 and the thin-film encapsulation layer 300B, and the relation between the fourth hole 200H and the fifth hole 300BH are the same as that described above.

The substrate 100B may include the first base layer 101, the first barrier layer 102, the second base layer 103, and the second barrier layer 104. Example materials thereof are the same as those described above with reference to FIG. 10. The second barrier layer 104 of the substrate 100B may be exposed through the fourth hole 200H and the fifth hole 300BH overlapping each other. The width W1 may correspond to a smaller one of the fourth hole 200H of the display layer 200 and the fifth hole 300BH of the thin-film encapsulation layer 300B. The width W1 may be equal to or less than the width W2 of the first portion 21 of the rear cover layer 20.

In another embodiment, the second barrier layer 104 of the substrate 100B may include a through hole 104h overlapping the fourth hole 200H and the fifth hole 300BH as shown in FIG. 20. The through hole 104h of the second barrier layer 104 may have the same size (or width) as that of the fourth hole 200H of the display layer 200 and/or the fifth hole 300BH of the thin-film encapsulation layer 300B. The size (or width) of the through hole 104h of the second barrier layer 104 may be equal to the size (or width) of the fourth hole 200H of the display layer 200 but different from the size (or width) of the fifth hole 300BH of the thin-film encapsulation layer 300B.

The width W1 of a smaller one selected from the through hole 104h of the second barrier layer 104, the fourth hole 200H of the display layer 200, and the fifth hole 300BH of the thin-film encapsulation layer 300B may be equal to or less than the width W2 of the first portion 21 of the rear cover layer 20.

The rear cover layer 20 may include the first portion 21 and the second portion 22 and cover the dimples D formed in the rear side of the substrate 100B. Characteristics of the rear cover layer 20 are the same as that described above with reference to FIG. 12. Though it is shown in FIGS. 19 and 20 that the rear cover layer 20 has the structure shown in FIG.

12, the present disclosure is not limited thereto. In another embodiment, each of the rear cover layers 20 described with reference to FIGS. 19 and 20 may have the structure described with reference to FIGS. 13, 15, and 17. In another embodiment, the rear cover layer 20 may be locally located so as to cover the first area A1 as described with reference to FIG. 7C.

The display device according to embodiments may improve progression of light (and/or sound) and transmission quality of light (and/or sound) in the transmission area by including the rear cover layer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A display device comprising:
a substrate;
an insulating layer on a top surface of the substrate;
a plurality of light-emitting diodes on the insulating layer and including two light-emitting diodes spaced apart from each other and having a transmission area therebetween;
an encapsulation member covering the plurality of light-emitting diodes; and
a rear cover layer on a rear surface of the substrate and including a first portion located in the transmission area,
wherein the first portion includes a transparent material,
wherein the rear cover layer further includes a second portion surrounding the first portion, and
wherein a thickness of the second portion is greater than a thickness of the first portion such that the first portion together with the second portion forms a step difference in the rear cover layer.

2. The display device of claim 1, wherein a difference between a refractive index of the first portion of the rear cover layer and a refractive index of the substrate is 0.5 or less.

3. The display device of claim 1, wherein the rear surface of the substrate includes a plurality of dimples, and at least one dimple that is located in the transmission area, from among the plurality of dimples, is filled with the transparent material of the first portion.

4. The display device of claim 1, wherein the substrate includes a glass material and/or a polymer resin.

5. The display device of claim 1, further comprising:
a first insulating layer on the top surface of the substrate;
a second insulating layer between a semiconductor layer of a transistor and a gate electrode, the transistor being on the first insulating layer; and
a third insulating layer between the transistor and the plurality of light-emitting diodes,
wherein at least one selected from the first insulating layer, the second insulating layer, and the third insulating layer includes a through hole located in the transmission area.

6. The display device of claim 5, wherein each of the first insulating layer, the second insulating layer, and the third insulating layer includes a through hole located in the transmission area, and
a width of a through hole having a smallest size among the through holes is less than a width of the first portion of the rear cover layer.

7. The display device of claim 1, wherein the step difference between the first portion and the second portion has an inclination surface, and a thickness of a portion of the rear cover layer that constitutes the inclination surface is greater than the thickness of the first portion and less than the thickness of the second portion.

8. The display device of claim 1, wherein the first portion and the second portion are spaced apart from each other.

9. The display device of claim 1, wherein the rear cover layer includes:
a first sub-layer on the rear surface of the substrate and including the first portion; and
a second sub-layer on the first sub-layer and including an opening corresponding to the transmission area.

10. The display device of claim 9, wherein the second sub-layer includes a material different from that of the first sub-layer.

11. The display device of claim 1, wherein the encapsulation member includes an encapsulation substrate of a glass material.

12. The display device of claim 11, further comprising an air layer between the substrate and the encapsulation substrate.

13. The display device of claim 11, further comprising a transparent material layer between the substrate and the encapsulation substrate.

14. The display device of claim 1, wherein the encapsulation member includes a thin-film encapsulation layer including at least one inorganic encapsulation layer and at least one organic encapsulation layer.

15. The display device of claim 14, wherein the thin-film encapsulation layer includes a hole corresponding to the transmission area.

16. A display device comprising:
a substrate;
a display layer on a top surface of the substrate and including two pixels spaced apart from each other and having a transmission area therebetween; and
a rear cover layer on a rear surface of the substrate and including a first portion corresponding to the transmission area,
wherein the first portion of the rear cover layer includes a transparent material,
wherein the rear cover layer includes the first portion and a second portion surrounding the first portion, and
wherein a thickness of the second portion is greater than a thickness of the first portion such that the first portion together with the second portion forms a step difference in the rear cover layer.

17. The display device of claim 16, wherein a difference between a refractive index of the rear cover layer and a refractive index of the substrate is 0.5 or less.

18. The display device of claim 17, wherein the substrate includes a glass material and/or a polymer resin.

19. The display device of claim 16, wherein the rear surface of the substrate includes a plurality of dimples, and
at least one dimple that corresponds corresponding to the transmission area, from among the plurality of dimples, is filled with the transparent material of the first portion.

20. The display device of claim 16, wherein the display layer includes:
- at least one insulating layer located on the top surface of the substrate and including a through hole corresponding to the transmission area; and
- a pixel electrode, an opposite electrode, and a stacked body each on the at least one insulating layer, the stacked body being between the pixel electrode and the opposite electrode.

21. The display device of claim 16, wherein the display layer includes a hole located in the transmission area.

22. The display device of claim 21, wherein a width of the hole of the display layer is less than a width of the first portion of the rear cover layer.

23. The display device of claim 16, wherein the step difference between the first portion and the second portion has an inclination surface, and a thickness of a portion of the rear cover layer that constitutes the inclination surface is greater than the thickness of the first portion and less than the thickness of the second portion.

24. The display device of claim 16, wherein the first portion and the second portion are spaced apart from each other.

25. The display device of claim 16, wherein the rear cover layer includes:
- a first sub-layer on the rear surface of the substrate; and
- a second sub-layer on the first sub-layer and including an opening corresponding to the transmission area.

26. The display device of claim 25, wherein the second sub-layer includes a material different from that of the first sub-layer.

27. The display device of claim 16, further comprising an encapsulation substrate covering the display layer and including a glass material.

28. The display device of claim 27, further comprising an air layer between the substrate and the encapsulation substrate.

29. The display device of claim 27, further comprising a transparent material layer between the substrate and the encapsulation substrate.

30. The display device of claim 16, further comprising a thin-film encapsulation layer covering the display area and including at least one inorganic encapsulation layer and at least one organic encapsulation layer.

31. The display device of claim 30, wherein the thin-film encapsulation layer includes a hole corresponding to the transmission area.

32. A display device comprising:
- a substrate;
- a display layer on a top surface of the substrate and including two pixels spaced apart from each other and having a transmission area therebetween; and
- a rear cover layer on a rear surface of the substrate,
- wherein the rear cover layer is located only in the transmission area, and
- wherein the rear cover layer includes a transparent material.

33. The display device of claim 32, wherein the rear surface of the substrate includes a plurality of dimples, and at least one dimple that is located in the transmission area, from among the plurality of dimples, is filled with the transparent material of the first portion.

34. The display device of claim 32, further comprising:
- a first insulating layer on the top surface of the substrate;
- a second insulating layer between a semiconductor layer of a transistor and a gate electrode, the transistor being on the first insulating layer; and
- a third insulating layer between the transistor and the plurality of light-emitting diodes,
- wherein at least one selected from the first insulating layer, the second insulating layer, and the third insulating layer includes a through hole located in the transmission area.

35. The display device of claim 34, wherein each of the first insulating layer, the second insulating layer, and the third insulating layer includes a through hole located in the transmission area, and
- a width of a through hole having a smallest size among the through holes is less than a width of the first portion of the rear cover layer.

* * * * *